US009264157B2

(12) United States Patent
Maruyama et al.

(10) Patent No.: US 9,264,157 B2
(45) Date of Patent: Feb. 16, 2016

(54) PROPAGATION PATH ESTIMATION METHOD AND PROGRAM AND APPARATUS USING THE SAME

(75) Inventors: Tamami Maruyama, Yokohama (JP); Tatsuo Furuno, Yokosuka (JP); Tomoyuki Ohya, Yokohama (JP); Jiyun Shen, Yokosuka (JP); Yasuhiro Oda, Yokosuka (JP); Ngoc Hao Tran, Shinagawa-ku (JP)

(73) Assignee: NTT DOCOMO, INC., Tokyo (JP)

( * ) Notice: Subject to any disclaimer, the term of this patent is extended or adjusted under 35 U.S.C. 154(b) by 756 days.

(21) Appl. No.: 13/513,694

(22) PCT Filed: Dec. 3, 2010

(86) PCT No.: PCT/JP2010/071742
§ 371 (c)(1),
(2), (4) Date: Aug. 8, 2012

(87) PCT Pub. No.: WO2011/068224
PCT Pub. Date: Jun. 9, 2011

(65) Prior Publication Data
US 2012/0303328 A1    Nov. 29, 2012

(30) Foreign Application Priority Data

Dec. 4, 2009 (JP) ................................ 2009-277070

(51) Int. Cl.
*H04B 17/00* (2015.01)
*H04W 16/18* (2009.01)
(Continued)

(52) U.S. Cl.
CPC ............ *H04B 17/104* (2015.01); *H04B 17/309* (2015.01); *H04B 17/391* (2015.01); *H04W 16/18* (2013.01); *G06F 17/5009* (2013.01); *H04B 17/00* (2013.01)

(58) Field of Classification Search
CPC ... H04W 16/18; H04B 17/00; H04B 17/0095; H04B 17/0037; H04B 17/104; H04B 17/309; H04B 17/391; G06F 17/5009
See application file for complete search history.

(56) References Cited

U.S. PATENT DOCUMENTS

| 4,201,474 A | 5/1980 | Holl et al. |
| 5,689,812 A | 11/1997 | Takahashi |

(Continued)

FOREIGN PATENT DOCUMENTS

| JP | 8 8846 | 1/1996 |
| JP | 2003 318842 | 11/2003 |
| JP | 2009 168534 | 7/2009 |

OTHER PUBLICATIONS

Hassan-Ali et al., "A New Statistical Model for Site-Specific Indoor Radio Propagation Prediction Based on Geometric Optics and Geometric Probability" IEEE Transactions on Wireless Communications, vol. 1, No. 1, Jan. 2002.*

(Continued)

*Primary Examiner* — Alexander Satanovsky
*Assistant Examiner* — John Kuan
(74) *Attorney, Agent, or Firm* — Oblon, McClelland, Maier & Neustadt, L.L.P.

(57) ABSTRACT

A propagation path estimation method using an imaging method according to the invention includes a step of, in a case where a reflect array 1 (structure) which causes reflection and scattering in a predetermined direction $(\theta-\eta)°$ different from a specular reflection direction $\theta°$ exists on a propagation path, rotating the reflect array 1 by $\eta/2°$ about a rotation center O to set a virtual rotated reflect array 2 (virtual structure), and estimating the propagation path by using the virtual rotated reflect array 2.

7 Claims, 21 Drawing Sheets

(51) Int. Cl.
*G06F 17/50* (2006.01)
*H04B 17/10* (2015.01)
*H04B 17/309* (2015.01)
*H04B 17/391* (2015.01)

(56) References Cited

U.S. PATENT DOCUMENTS

| | | |
|---|---|---|
| 2008/0161005 A1 | 7/2008 | Sato et al. |
| 2010/0076730 A1 | 3/2010 | Yonezawa et al. |
| 2012/0302177 A1 | 11/2012 | Maruyama et al. |
| 2012/0303328 A1 | 11/2012 | Maruyama et al. |

OTHER PUBLICATIONS

Neskovic et al., "Modern Approaches in Modeling of Mobile Radio Systems Propagation Environment" IEEE Communications Surveys Third Quarter 2000.*

Furuno, T., et al., "A Propagation Estimation Method for Using Beam Controlled Reflector," Proceedings of the IEICE Conference, vol. 2009, pp. 18-21, (Mar. 4, 2009).

Furuno T., et al., "A Study of Area Coverage Imporvement by using Beam Controlled Reflector," Proceedings of the IEICE Conference, vol. 2009, pp. 19-21, (Sep. 1, 2009).

Hosoya, Y., "Denpadenpan Handbook (Radiowave Propagation Handbook)," Realize, Inc., pp. 234-245, (Jan. 1999) (with English translation).

"ERM-RTM Riron Setsumeisho," Jouhousuuri Kenkyusho, Total 37 Pages, (Nov. 2006) (with English translation).

Li, L., et al., "Microstrip Reflectarray Using Crossed-Dipole with Frequency Selective Surface of Loops," ISAP2008, TP-C05, 1645278, Total 4 Pages, (2008).

Maruyama, T., et al., "Experiment and Analysis of Reflect Beam Direction Control using a Reflector having Periodic Tapered Mushroom-like Structure," ISAP2008, MO-ISI, 1644929, pp. 9-12, (2008).

Seidel, S.Y., et al., "A Ray Tracing Technique to Predict Path Loss and Delay Spread Inside Buildings," IEEE Globecom'92, vol. 2, pp. 649-653, (1992).

International Search Report Issued Feb. 1, 2011 in PCT/JP10/71742 Filed Dec. 3, 2010.

Office Action issued Jan. 13, 2014 in Chinese Patent Application No. 201080055588.0 (with English language translation).

"Research related to theory and method of ray tracing to determine the location of a mobile terminal of a cellular communication system", Entire database of Chinese doctoral dissertation: Information Science and Technology Series, Dec. 15, 2004, pp. 43-50 (with English language translation).

Extended European Search Report issued Mar. 30, 2015 in Patent Application No. 10834674.3.

Berndie Strassner, et al., "Circularly Polarized Reflectarray With Microstrip Ring Elements Having Variable Rotation Angles" IEEE Transactions on Antennas and Propagation, vol. 52, No. 4, XP011111953, 2004, pp. 1122-1125.

* cited by examiner

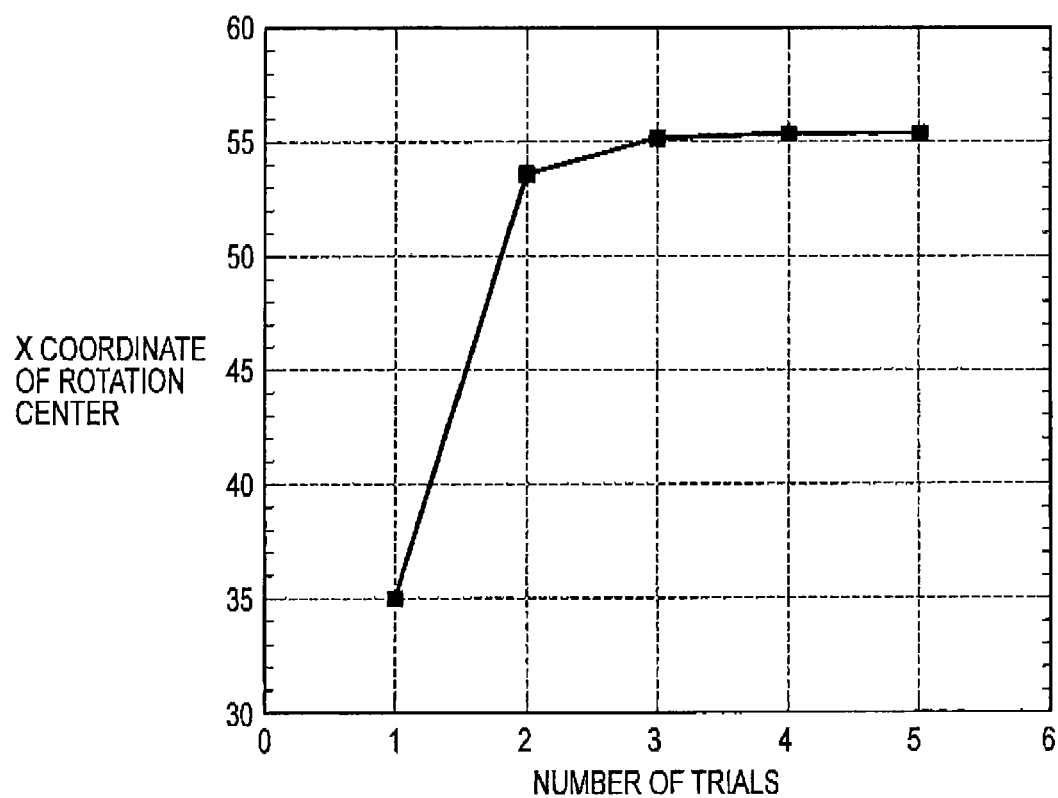

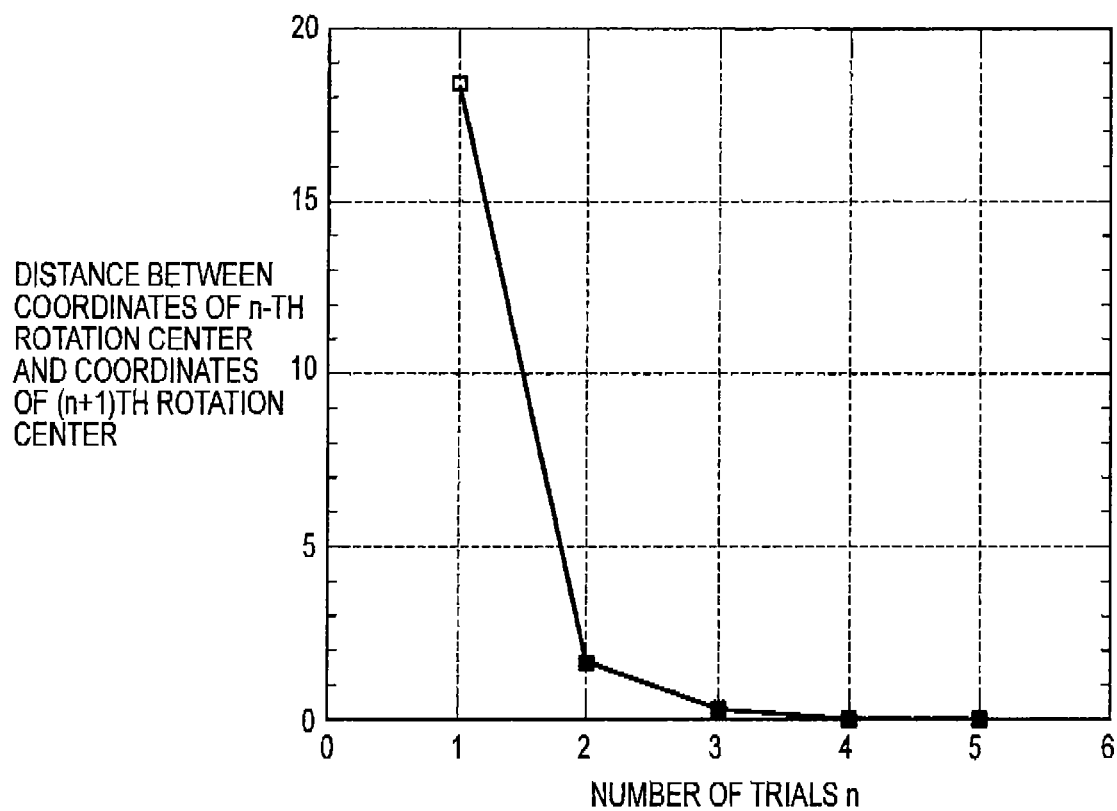

PROPAGATION PATH ESTIMATION METHOD AND PROGRAM AND APPARATUS USING THE SAME

TECHNICAL FILED

The present invention relates to a propagation path estimation method, program and apparatus.

More particularly, the present invention relates to a unit configured to analyze a scatterer not making a specular reflection in an analysis such as Geometrical Optics (GO) and Geometrical Theory of Diffraction (GTD) using a geometric-optical model, a ray trace analysis and an analysis using an imaging method.

BACKGROUND ART

Conventionally, an analysis method using a geometric-optical model is widely known as a method for analyzing the propagation characteristics of radio wave (for example, see Non-Patent Document 1).

FIG. 1 shows a method for obtaining a radio wave propagation path by a conventional ray trace method.

As shown in FIG. 1, the conventional ray trace method includes three steps. The first step determines an image point T' of a transmission point T with respect to a wall surface 1 and then determines an image point T" of the image point T' with respect to a wall surface 2.

In the second step, T" and a reception point R are connected to each other with a straight light, and a point where the straight line and the wall surface 2 intersect to each other is obtained. The intersection point thus obtained is a reflection point X2 on the wall surface 2.

In the third step, the reflection point X2 on the wall surface 2 and T' are connected to each other with a straight line to obtain a reflection point X1 on the wall surface 1.

In this case, the propagation distance takes the same value as a length of the straight line connecting T" and the reception point R to each other. The electric field intensity at the reception point R can be obtained using the propagation distance.

FIG. 2 shows a conventional method for obtaining the propagation paths of a transmitted wave and a reflected wave (for example, see Non-Patent Document 2).

Further, Patent Document 1 discloses a method for estimating propagation characteristics for a case in which a transmission direction is other than a rectilinear direction, and a reflection direction is other than a specular reflection direction.

PRIOR ART DOCUMENTS

Patent Document

Patent Document 1: Japanese Patent Application Publication No. 2009-168534

Non-Patent Documents

Non-Patent Document 1: Yoshio Hosoya, "DENPADENPAN HANDBOOK (Radiowave Propagation Handbook)," p. 234-245, Realize Inc.
Non-Patent Document 2: "EEM-RTM RIRON SETSUMEISHO," JOUHOUSUURI KENKYUSHO, http://www.imslab.co.jp/R Product/eem/doc/rtm_theory.pdf
Non-Patent Document 3: L. Li, Q. Chen, Q. Yuan, K. Sawaya, T. Maruyama, T. Furuno and S. Uebayashi, "Miscrostrip Reflectarray Using Crossed-Dipole with Frequency Selective Surface of Loops" ISAP2008, TP-C05, 1645278, 2008
Non-Patent Document 4: T. Maruyama, T. Furuno and S. Uebayashi: "Experiment and Analysis of Reflect Beam Direction Control using a Reflector having Periodic Tapered Mushroom-like Structure," ISAP2008, MO-IS1, 1644929, p. 9, 2008

SUMMARY OF THE INVENTION

In the methods mentioned above, however, the travel direction of the reflected wave is limited to a specular reflection direction (normal reflection direction), and the travel direction of the transmitted wave is limited to a rectilinear direction, as shown in FIG. 1 and FIG. 2.

Accordingly, the above methods have not been capable of analyzing propagation characteristics of scattering in a direction other than the specular reflection direction and propagation characteristics with refraction of a medium taken into account.

FIG. 3 shows an example of the propagation path of scattering in a direction other than the specular reflection direction.

In FIG. 3, a wall surface 3 and a wall surface 4 are directional scatterers that respectively scatter reflected wave in directions different from the specular reflection direction. On the wall surface 3, radio wave incident from an incident direction A1° scatters in a reflection direction A2° at a reflection point x3. On the wall surface 4, radio wave incident from an incident direction B1° scatters in a reflection direction B2° at a reflection point x4.

As a result of obtaining the path of the radio wave for the above case by using a conventional imaging method, the reflection point on the wall surface 4 is x2, which is different from the reflection point x4. This indicates that the reflection point on the wall surface 4 cannot be obtained by the convention method shown in FIG. 1. Accordingly, the conventional imaging method has a problem that the propagation path cannot be calculated by using a mirror image.

Meanwhile, in recent years, there have been reported application examples using a reflect array or metamaterial as a directional scatterer for improvement of the propagation environment (Non-Patent Documents 3 and 4).

Analyzing propagation characteristics of radio wave when the directional scatterer exists in a propagation path of the radio wave between the transmission point T and the reception point R is important in analyzing effects of improving the propagation environment, but the analysis has been difficult with a conventional ray trace method.

In contrast, the method disclosed in Patent Document 1 can estimate the propagation path by using an algorithm of obtaining a path and deleting the path, but cannot estimate the propagation path only on the basis of the structure of thereof before the analysis. Hence, the method has a drawback of needing the calculation more frequently.

The present invention has been made to solve the problems mentioned above. It is an objective of the present invention to provide a propagation path estimation method, program and apparatus that are capable of estimating a propagation path in a propagation analysis model including a directional scatterer and of performing a ray trace analysis or an analysis applying geometric-optical model.

The first feature of the present invention is summarized in that a propagation path estimation method using an imaging method, the method comprising a step of, in a case where a structure which causes reflection and scattering in a different direction $(\theta-\eta)°$ from a specular reflection direction $\theta°$ exists on a propagation path, rotating the structure by η/2° about a rotation center point to set a virtual structure, and estimating the propagation path by using the virtual structure.

BRIEF DESCRIPTION OF DRAWINGS

FIG. 28 is a diagram showing a convergence state of the reflection point by the propagation path estimation method according to the fifth embodiment of the present invention (Part 1 with 70-degree rotation).

FIG. 29 is a diagram showing a convergence state of the reflection point by the propagation path estimation method according to the fifth embodiment of the present invention (Part 2 with 70-degree rotation).

MODES FOR CARRYING OUT THE INVENTION

First Embodiment of the Present Invention

A propagation path estimation method according to a first embodiment of the present invention is described with reference to FIG. 4.

Figure 1:
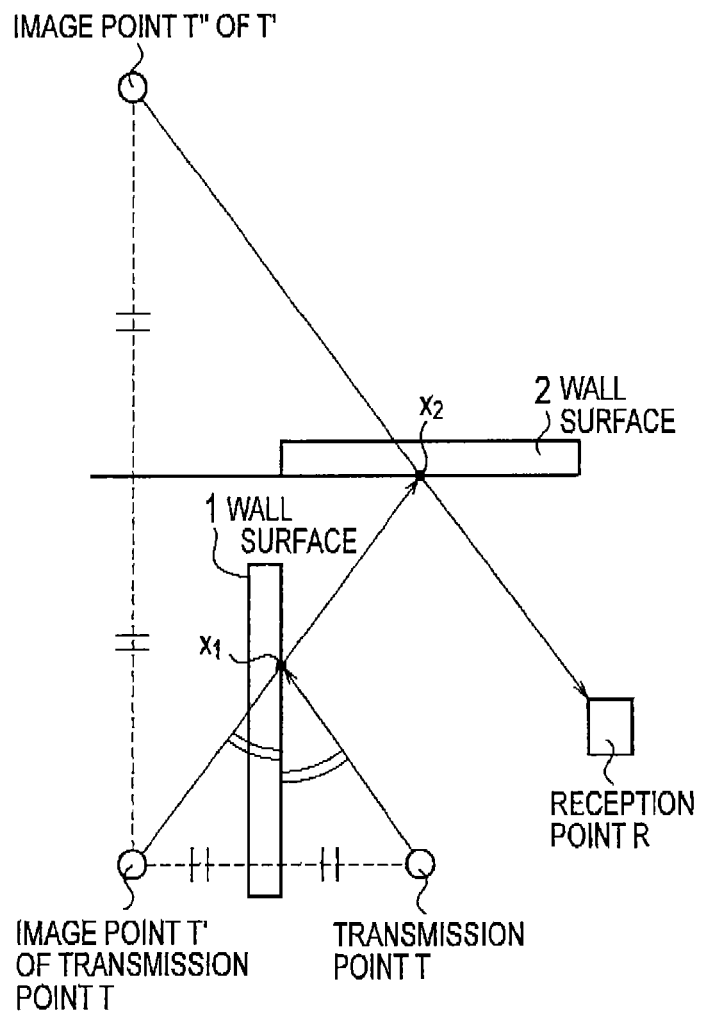
FIG. 1 is a diagram for explaining a method for obtaining the propagation path of radio wave by a conventional ray trace method.
Figure 2:
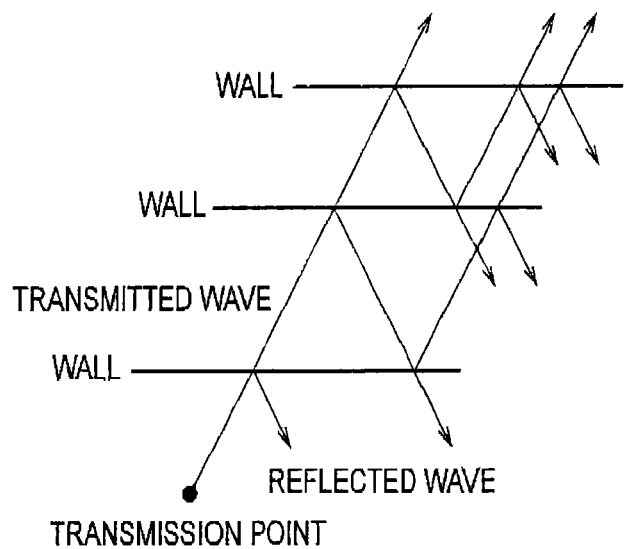
FIG. 2 shows a conventional method for obtaining the propagation path of a transmitted wave and a reflected wave.
Figure 3:
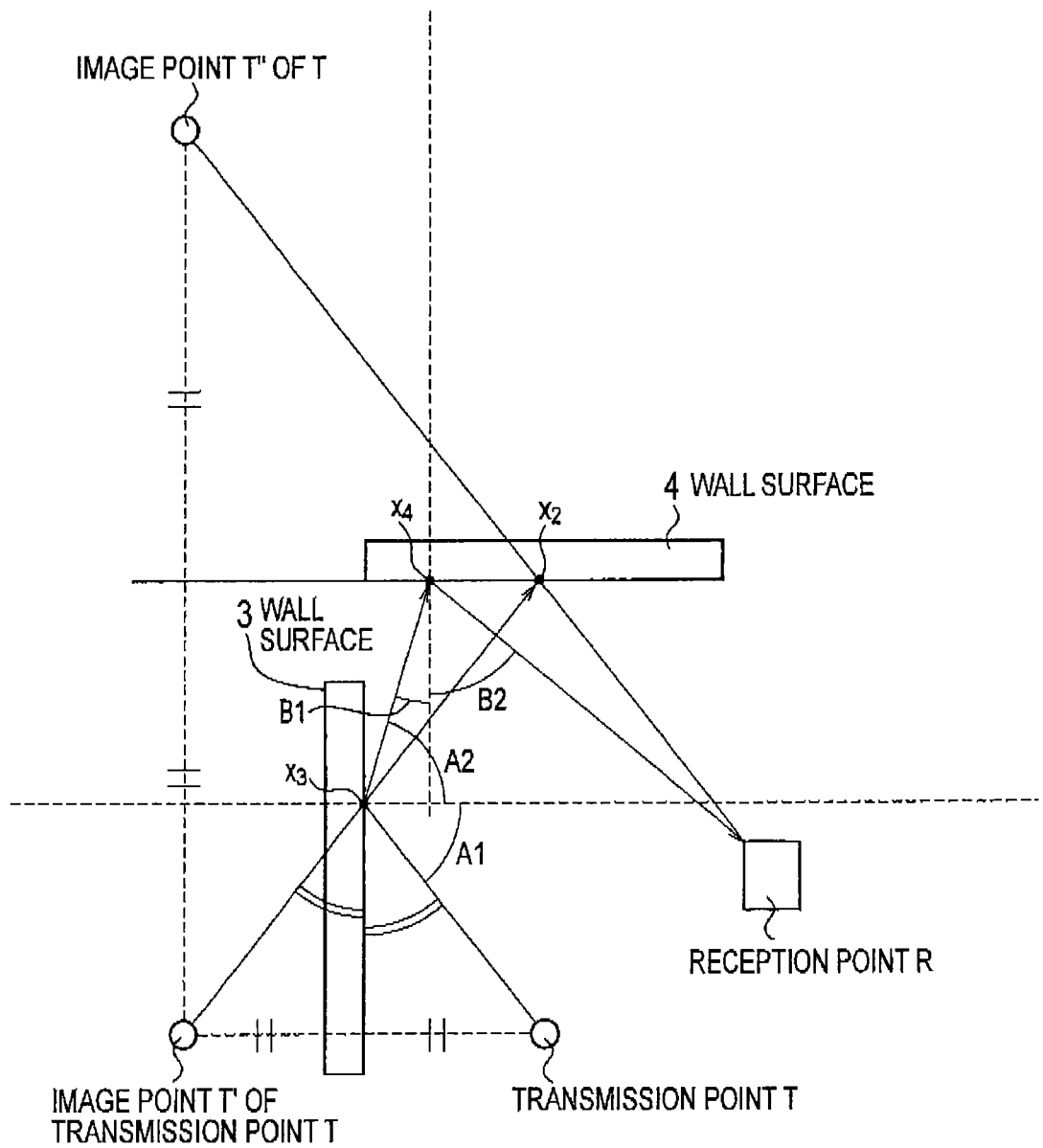
FIG. 3 is a diagram for explaining problems of the conventional method.
Figure 4:
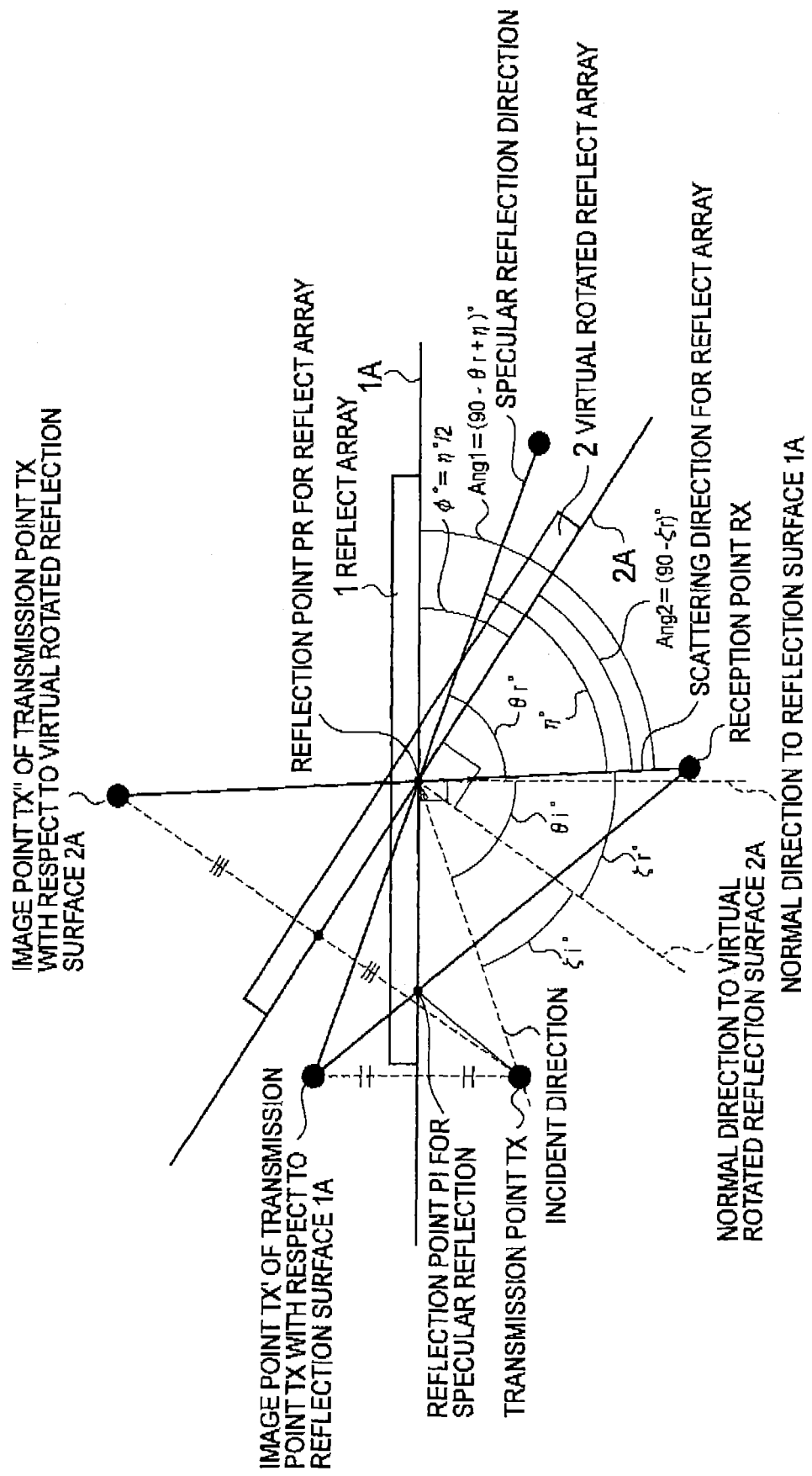
FIG. 4 is a diagram for explaining a propagation path estimation method according to a first embodiment of the present invention.

FIG. 4 shows that radio wave incident from an incident direction $\theta_i°$ (herein, $\theta_i°$ refers to an angle formed by the incident direction and a normal direction to a reflection surface 1A of a reflect array, like an incident angle according to the general electromagnetic field theory) onto a reflect array 1 and scatters in a direction rotated by η° from a specular reflection direction $\theta_r°$ (herein, $\theta_r°$ refers to an angle formed by the specular reflection direction and the normal direction to the reflection surface 1A of the reflect array 1, like a reflection angle according to the general electromagnetic field theory).

In the present description, the incident direction is defined by the incident angle, and the reflection direction is defined by the reflection angle. In FIG. 4, $\theta_i°=\theta_r°$.

According to a conventional imaging method, a propagation distance of the specular reflection can be obtained by connecting an image point TX' of a transmission point TX with respect to the reflect array 1, and a reception point RX to each other with a straight line. Here, a reflection point of the specular reflection is a point PI where the straight line connecting TX' and the reception point RX to each other, and the reflect array 1 intersect with each other.

Further, the propagation path of the specular reflection is formed by a straight line from the transmission point TX to PI, and a straight line from PI to the reception point RX.

However, a real propagation path is formed by a straight line from the transmission point TX to PR, and a straight line from PR to the reception point RX. Therefore, such a propagation path and propagation distance cannot be obtained with the conventional imaging method. Here, PR represents a reflection point of the reflect array 1.

Here, a virtual rotated reflect array 2 (virtual structure) is set by rotating the reflect array 1 (structure) by $\phi°=\eta°/2$ about PR.

With this setting, a propagation distance for the reflect array 1 can be obtained by connecting an image point T" of the transmission point TX with respect to the virtual rotated reflect array 2, and the reception point RX to each other. Here, $\zeta_i°$ represents an incident angle on the virtual rotated reflect array 2, $\zeta_r°$ represents a specular reflection angle on the virtual rotated reflect array 2, and $\zeta_i°=\zeta_r°$.

Here, a rotation angle $\phi°$ of the virtual reflect array can be obtained in the following steps.

Assuming that an angle formed by the reflection surface 1A of the reflect array 1 and a line connecting the reception point RX and the reflection point PR on the reflection surface 1A of the reflect array 1 to each other is Ang1, $$Ang1=(90-\theta_r=\eta)° \qquad (1)$$

Assuming that an angle formed by a reflection surface 2A of the virtual rotated reflect array 2 and a line connecting the reception point RX and the reflection point PR to each other is Ang2, $$Ang2=(90-\zeta_r)° \qquad (2)$$

Since an angle formed by the reflection surface 1A of the reflect array 1 and the reflection surface 2A of the virtual rotated reflect array 2 is a rotation angle $\phi°$ of the reflect array, $$\phi°+Ang2=Ang1 \qquad (3)$$

Accordingly, from (1) to (3), $$\phi°=\zeta_r°-\theta_r°+\eta° \qquad (4)$$

Here, substituting $\zeta°$ and $\theta°$ as follows, Formula (7) holds:

$$\zeta°=\zeta_r°=\zeta_i° \qquad (5)$$

$$\theta°=\theta_r°=\theta_i° \qquad (6)$$

$$\zeta°=(2\theta°-\eta°)/2 \qquad (7)$$

From relation between Formula (4) and Formula (7), a relation of "$\phi°=\eta°/2$" can be obtained.

Second Embodiment of the Invention

Next, a method for obtaining a direction control reflection surface, for example, the reflection surface 1A of the reflect array 1 (directional scatterer), is described.

As shown in the first embodiment described above, the propagation path can be obtained by rotating the reflection surface 1A of the reflect array 1 just by $(\eta°/2)$ about a rotation center point O and then setting the virtual rotated reflection surface 2A which is a reflection surface of the virtual rotated reflection array 2.

However, the imaging method in general obtains a propagation path first and then uses an intersection point between the propagation path and a reflection surface as a reflection point. For this reason, it is difficult in general to obtain a rotation center point O (or the reflection point) in advance. In the present embodiment, steps of determining the reflection point are described with reference to FIG. 5 to FIG. 7.

(First Step)

Figure 5:
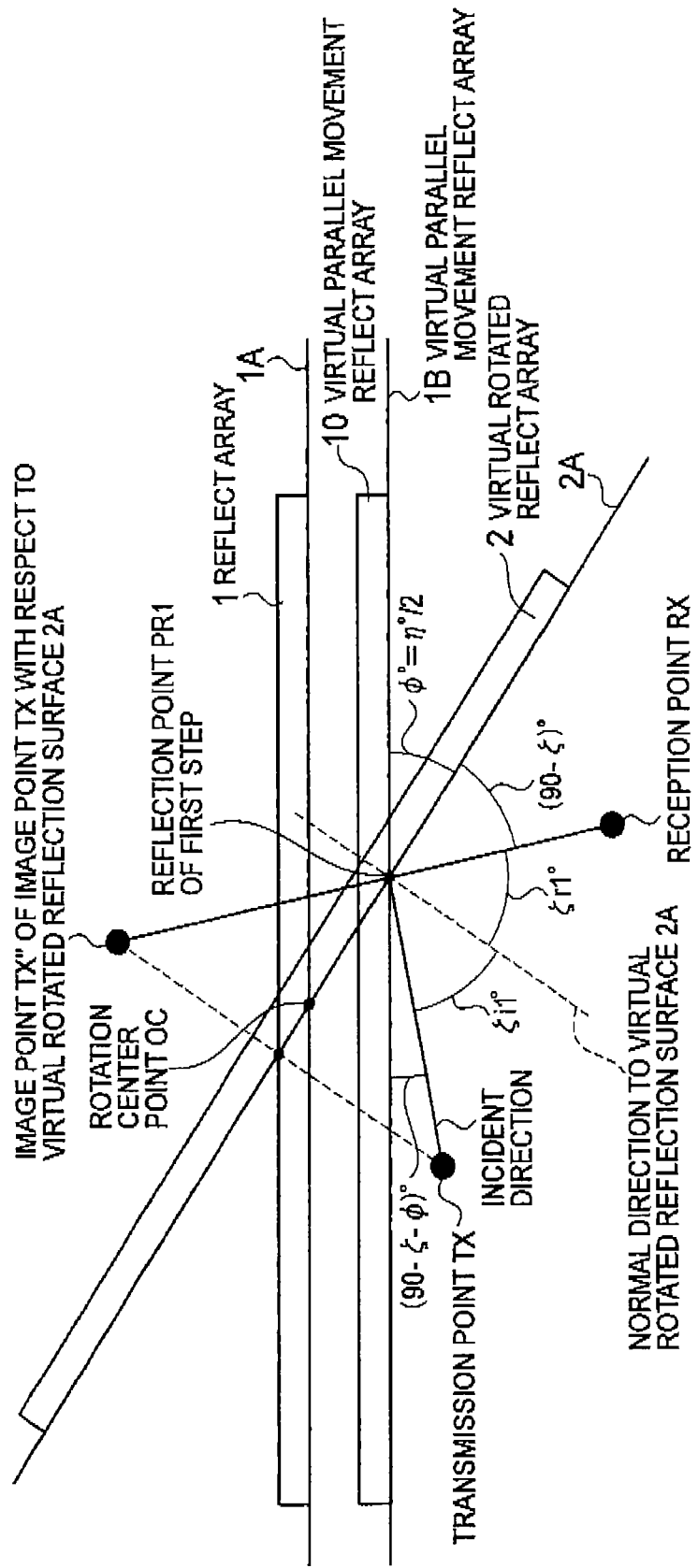
FIG. 5 is a diagram for explaining a propagation path estimation method according to a second embodiment of the present invention (first step).

As shown in FIG. 5, firstly, a virtual rotated reflection surface 2A, which is a reflection surface of a virtual rotated reflect array 2, is set by rotating a reflection surface 1A just by $(\eta/2)°$ with a center point O of the reflection surface 1A of the reflect array 1 as a rotation center point OC.

In the second step, an image point (mirror image) TX' of the transmission point TX is created with respect to the virtual rotation reference surface 2A.

In the third step, an intersection point between a straight line connecting TX" and a reception point RX to each other, and the virtual rotated reflection surface 2A is used as a first step reflection point PR1.

As shown in FIG. 5, a propagation path of radio wave, which is incident to the virtual rotated reflection surface from the transmission point TX in an incident direction ($\zeta_{i1}°$ and reflects in a reflection direction $\zeta_{r1}°$ (specular reflection direction on the virtual rotated reflection surface 2A) toward the reception point RX, can be obtained.

Here, $\zeta_{i1}°$ represents an angle formed by a normal direction to and an incident direction on the virtual rotated reflection surface 2A, $\zeta_{r2}°$ represents an angle formed by a normal direction to and a specular reflection direction an the virtual rotated reflection surface 2A, and "$\zeta_{i1}°=\zeta_{r1}°$."

In the fourth step, a virtual parallel movement reflection surface 1B, which is a reflection surface of the virtual parallel movement reflect array 10 which passes the first step reflection point PR1 and is parallel with an original reflect array 1, is set. Then, an angle formed by the virtual parallel movement reflection surface 1B and a line from the transmission point TX to the first step reflection point PR1 is $(90-\zeta-\phi)°$ (Here, $\zeta°=\zeta_{i1}°=\zeta_{r1}°$).

Further, an angle formed by a line from the first step reflection point PR1 to the reception point RX and the virtual parallel movement reflection surface 1B is $(\phi+90-\zeta)°$. Since "$\phi=\eta°/2$," the angle is equal to an angle of the specular reflection direction $(90-\zeta-\phi)°$ plus a control angle $\eta°$ of the reflection direction. That is, in the first step, a propagation path including the reflect array 1 whose reflection direction is controlled by $\eta°$ can be obtained with respect to the virtual parallel movement reflection surface 1B.

However, there occurs an error from a propagation path including the reflect array 1 since the first step reflection point PT1 exists at a point apart from the reflect array 1.

Figure 6:
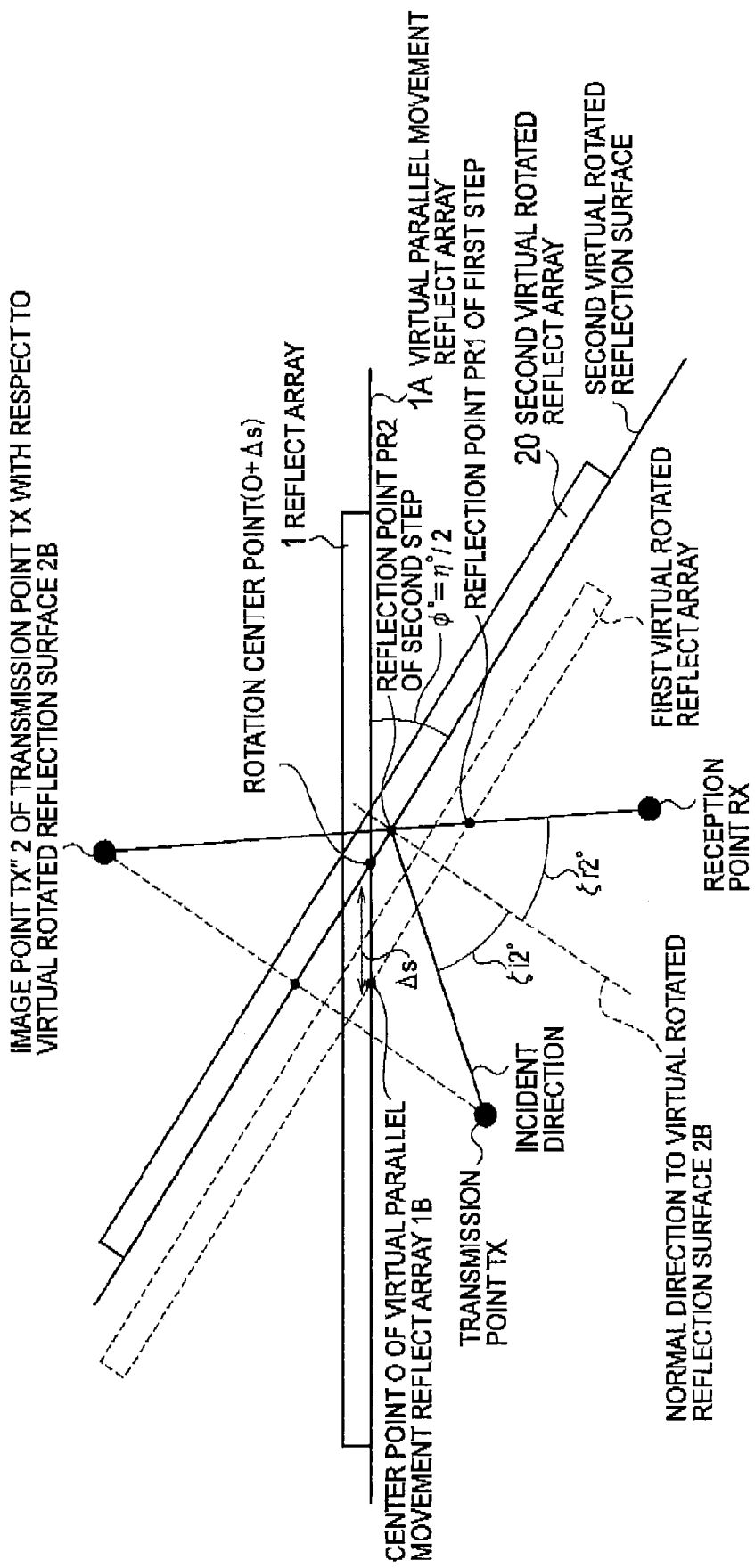
FIG. 6 is a diagram for explaining the propagation path estimation method according to the second embodiment of the present invention (second step).

Therefore, a method shown in FIG. 6 is used as a second step as described hereinafter.

(Second Step)

As shown in FIG. 6, a second virtual rotation reflection surface 2B is set by rotating the reflection surface 1A of the reflect array 1 just by $(\eta/2)°$ with a point of the first step rotation center point OC plus a predetermined $\Delta s$ as a rotation center point OC. Then, a second reflection point PR2 is obtained in a same manner as the first step.

That is, "(second rotation center OC)=(first rotation center OC)+$\Delta s$=O+$\Delta s$."

Here, when a distance between the reflection point PR2 and the reflection surface 1A of the reflect array 1 is longer than a predetermined convergence condition (for example, $\Delta s$), a third rotation reflection surface 1C is set, as a second step, by rotating the reflection surface 1A of the reflect array 1 just by $(\eta/2)°$ about (O+2×$\Delta s$) as a rotation center point OC. Then, the above steps are repeated until the convergence condition is satisfied.

That is, "(third rotation center OC)=(second rotation center OC)+$\Delta s$=O+2$\Delta s$."

Hereinafter, an operation flow in the propagation path estimation method according to the present embodiment is described with reference to a flowchart shown in FIG. 7.

Figure 7:
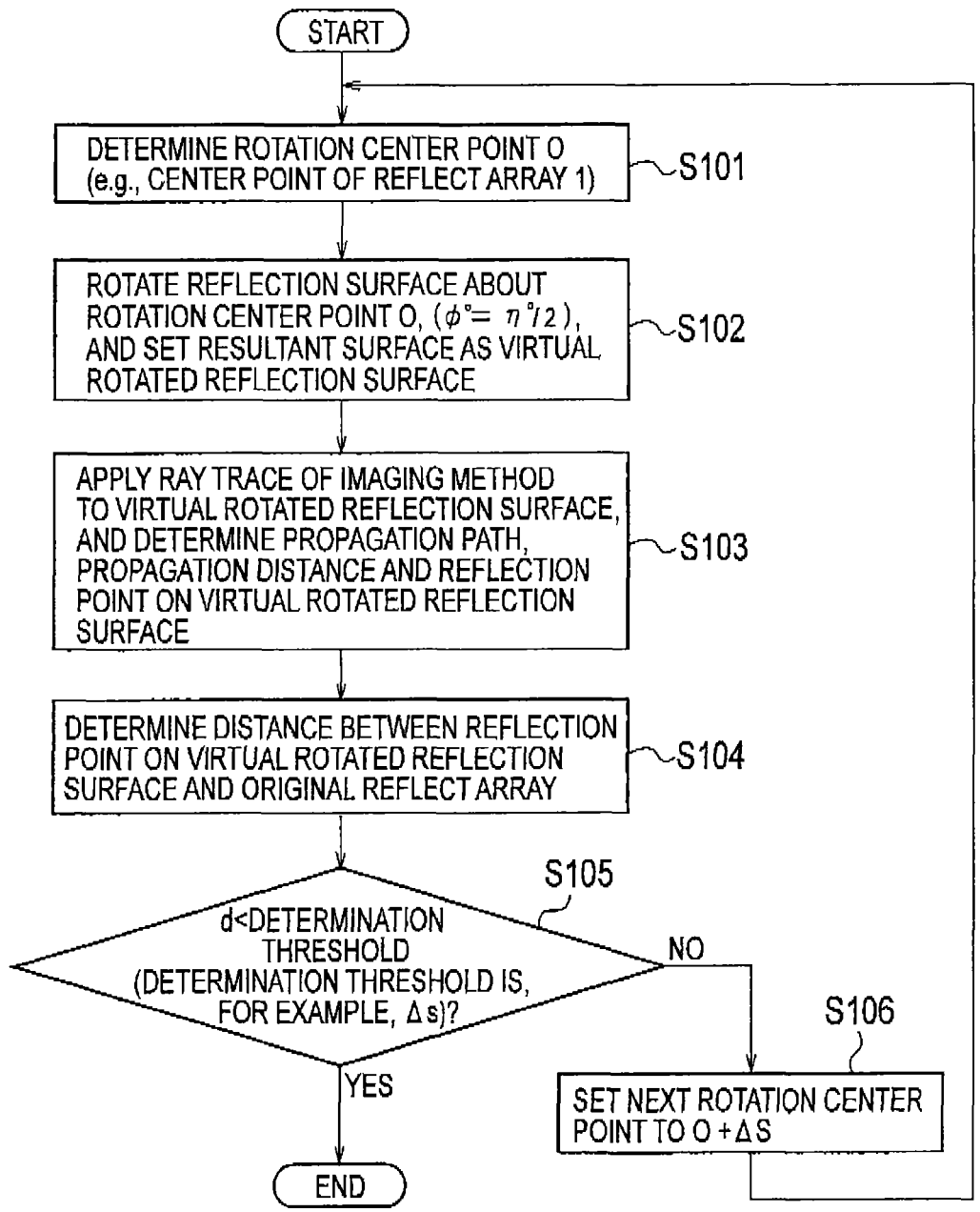
FIG. 7 is a flowchart showing the propagation path estimation method according to the second embodiment of the present invention.

As shown in FIG. 7, in Step S101, the rotation center point OC (for example, a center point of the reflect array) is determined.

In Step S102, a virtual rotated reflection surface is set by rotating a presently set reflection surface (the reflection surface 1A of the reflect array 1 or an n-th virtual parallel movement reflection surface) about the rotation center point O.

In Step S103, a propagation path, a propagation distance, and a reflection point on the virtual rotated reflection surface are determined on the basis of a ray tracing by an imaging method using the virtual rotated reflection surface.

In Step S104, a distance d between the determined reflection point on the virtual rotated reflection surface and the reflection surface 1A of the reflect array 1 is calculated.

In Step S105, it is determined whether or not "d<determination threshold (for example, Δs)" is satisfied.

If "YES," the operation ends. If "NO," the operation goes to Step S106 and returns to Step S101. In Step S106, a next rotation center point is set to O+Δs.

Third Embodiment of the Invention

A propagation path estimation method according to a third embodiment of the present invention is described with reference to FIG. 8 and FIG. 9.

The propagation path estimation method according to the third embodiment of the present invention is characterized in that a distance between an n-th step reflection point PRn obtained by a propagation path estimation method according to the second embodiment and an n-th step rotation center point (for example, a center point O of the reflect array 1) is set as $\Delta L_n$, and an (n+1)th rotation center point is set as "O+$\Delta L_n$ (if O is zero, $\Delta L_n$)."

Figure 8:
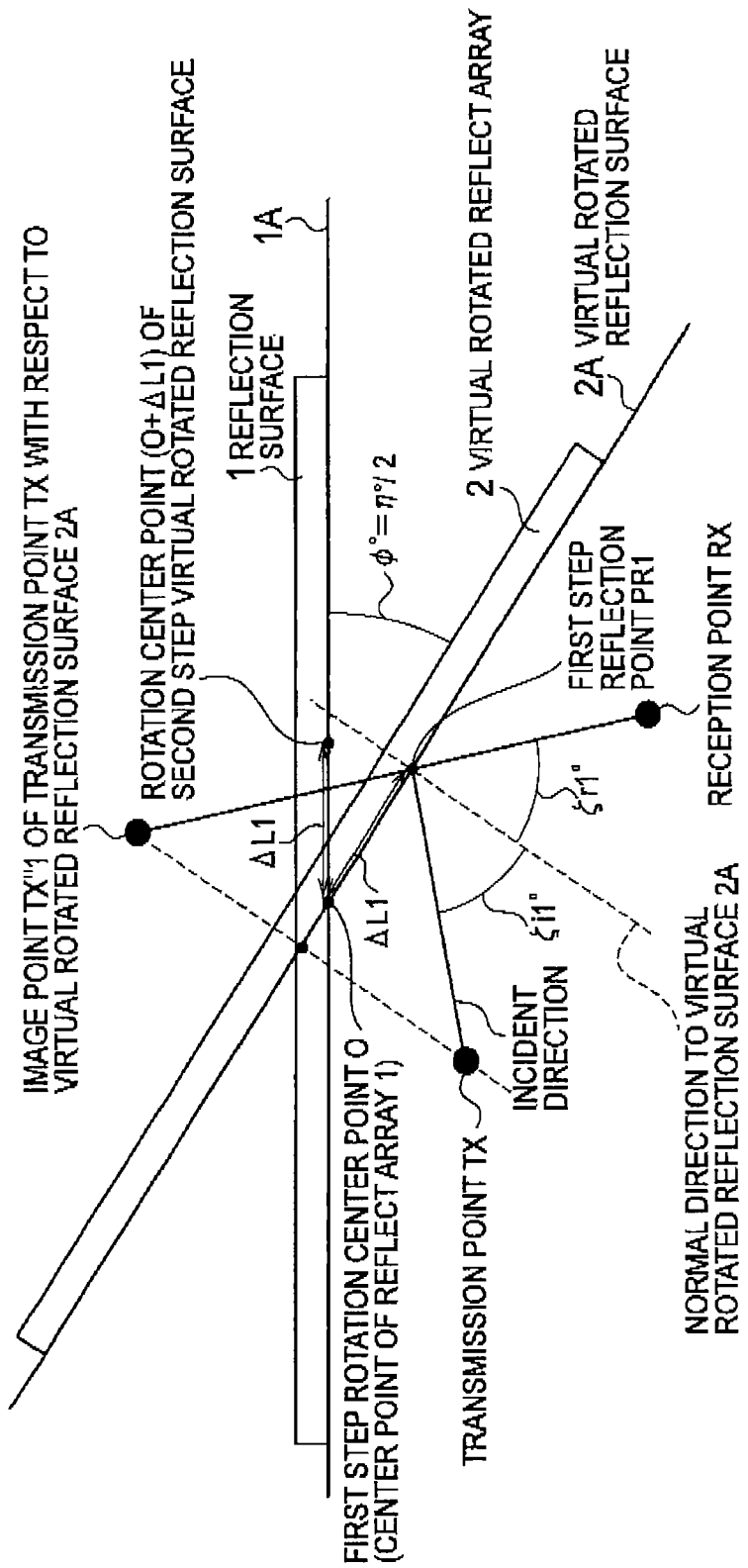
FIG. 8 is a diagram for explaining a propagation path estimation method according to a third embodiment of the present invention (first step).

FIG. 8 is a diagram for explaining a first step in the propagation path estimation method according to the third embodiment, showing that a value of $\Delta L_1$ is obtained as a distance to the first step rotation center point (for example, a center point of the reflect array 1).

Figure 9:
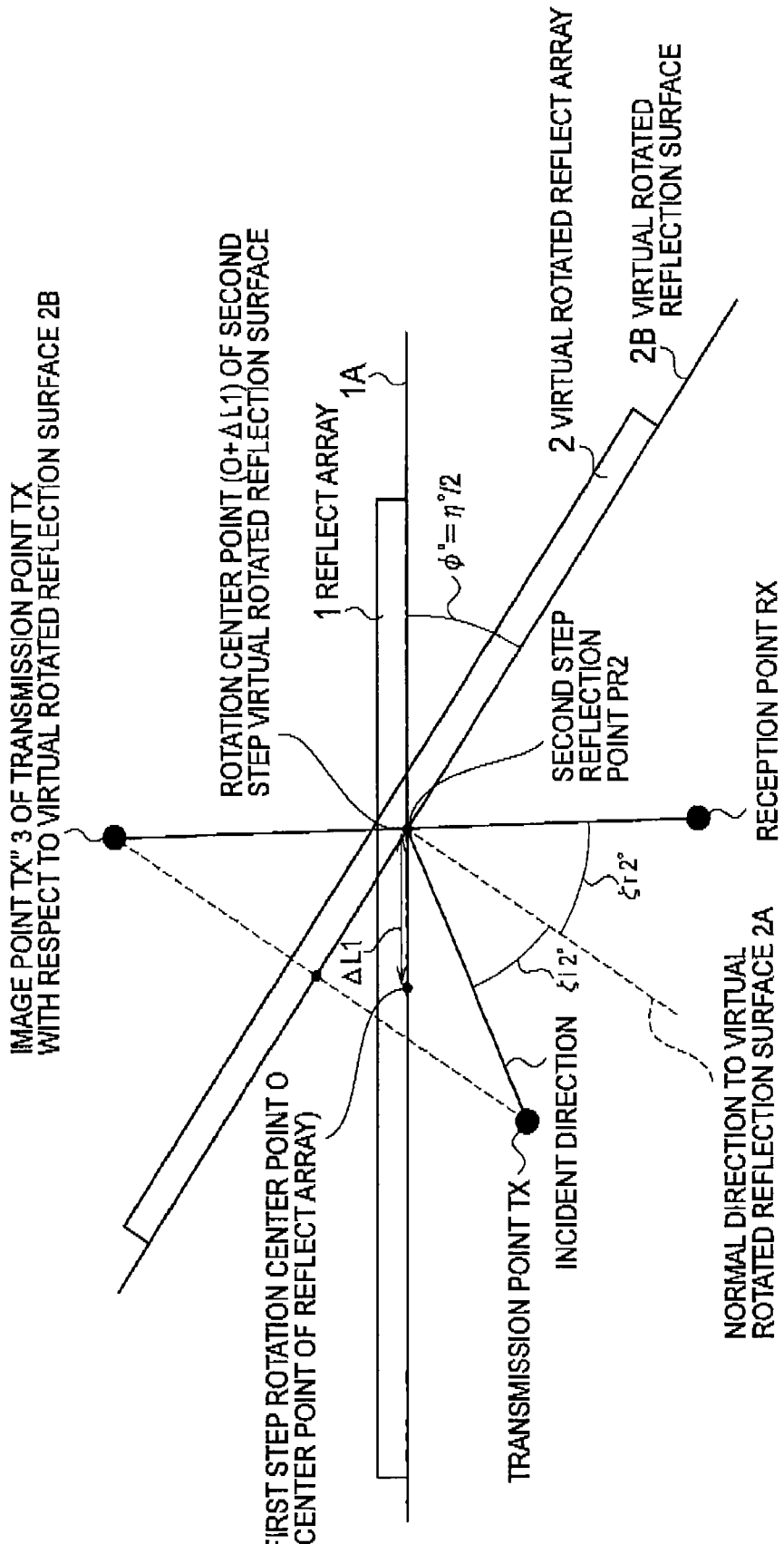
FIG. 9 is a diagram for explaining the propagation path estimation method according to the third embodiment of the present invention (second step).

FIG. 9 is a diagram for explaining a second step in the propagation path estimation method according to the third embodiment, showing that the reflection surface 1A is rotated just by "φ=η°/2" with a point (O+ΔLn) as a rotation center point. Here, if the distance d between the reflection surface 1A of the original reflect array 1 and the reflection point PR2 in the second step satisfies the convergence condition, the processing ends.

The propagation path estimation method according to the embodiment described above may be applied when a structure other than the reflect array 1 exists. Further, in the propagation path estimation method according to the embodiment described above, the virtual rotated reflection surface may be set on the basis of a path when there exist a plurality of propagation paths (paths) passing via the reflect array 1.

Fourth Embodiment of the Invention

A propagation path estimation method according to a fourth embodiment of the present invention 15 described with reference to FIG. 10 to FIG. 13. In the present embodiment, a calculation example of the propagation path estimation method is described by using specific values.

Figure 10:
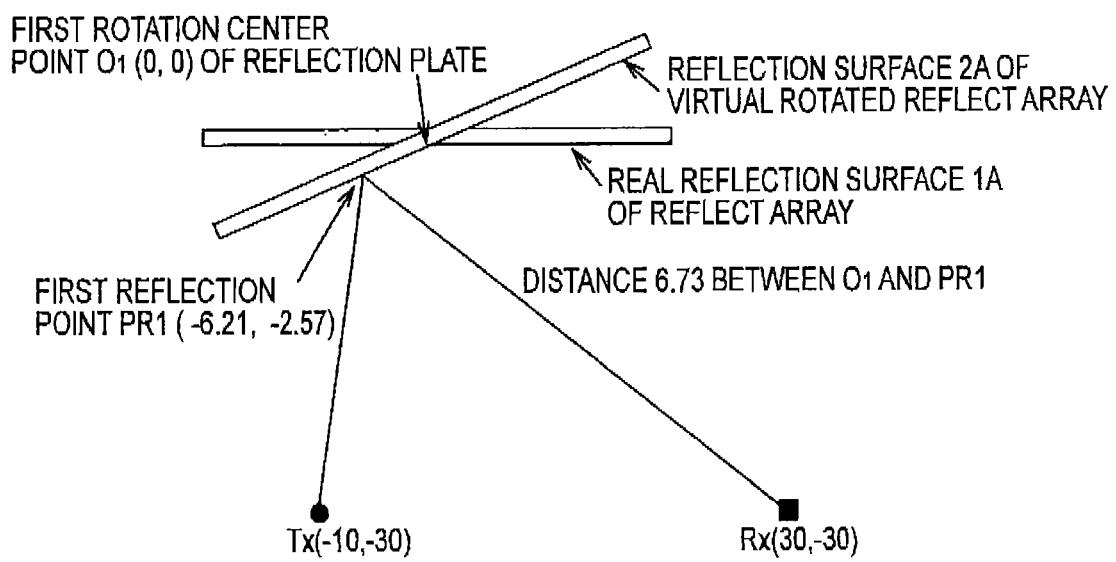
FIG. 10 is a diagram for explaining a propagation path estimation method according to a fourth embodiment of the present invention (first time).

FIG. 10 shows that the reflection surface 1A of the reflect array is rotated by an angle of η/2 about a rotation center $O_1$. In this calculation example, two-dimensional coordinates with a first rotation center point $O_1$ as an origin of the coordinates are considered. The coordinates of the transmission point are set as (−10, −30), and the coordinates of the reception point are set as (30, −30). The rotation angle η is set as −45 degrees (45 degrees counterclockwise).

The reflection surface 1A of the reflect array rotated by a rotation angle η/2 or −22.5 degrees about the rotation center $O_1$ is set as a reflection surface 2A of a virtual rotated reflect array.

Next, a mirror image Tx" of the transmission point Tx is created on the reflection surface 2A of the virtual rotated reflect array, and a straight line connecting Tx' and the reception point RX to each other is set as PR1. On this basis, the coordinates of PR1 are (−6.21, −2.57). A distance of 6.73 between a first rotation center $O_1$ and a first reflection point PR1 can be obtained by calculation.

Figure 11:
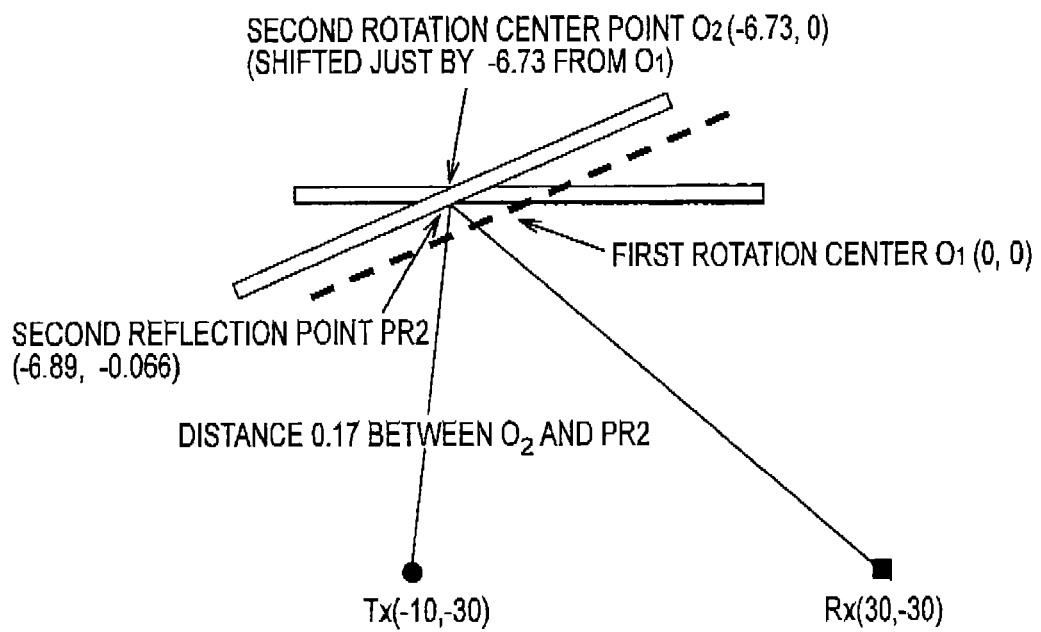
FIG. 11 is a diagram for explaining the propagation path estimation method according to the fourth embodiment of the present invention (second time).

A next step is described with reference to FIG. 11. As the next step, a point (−6.73, 0) shifted by a distance (−6.73) along the reflection surface 1A of the reflect array from the rotation center $O_1$ is obtained and set as a second rotation center $O_2$. A virtual rotated reflect array is created by rotating by an angle of η/2 with $O_2$ as a rotation center. That is, the virtual rotated reflect array is shifted in the horizontal direction in such a manner that the rotation center of the virtual rotated reflect array overlaps $O_2$. A mirror image of the transmission point Tx is created on a virtual reflect array rotated about $O_2$. The rotation center of the virtual rotated reflect array does not have to coincide with a midpoint in a horizontal direction of the reflection surface of the virtual rotated reflect array, and a distance from the rotation center to one end of the virtual rotated reflect array may be different from a distance from the rotation center to the other end of the virtual rotated reflect array.

Further, the shifted point may be a point to which the rotation center of the virtual reflection plate is shifted just by (−6.73) from the midpoint of the virtual reflection plate.

A point where a straight line connecting the mirror image of Tx and the reception point RX to each other and the reflection surface intersect with each other is set as PR2. At that time, the coordinates of PR2 are (−6.89, 0.066). A distance of 0.17 between the second rotation center $O_2$ and the second reflection point PR can be obtained by calculation.

Figure 12:
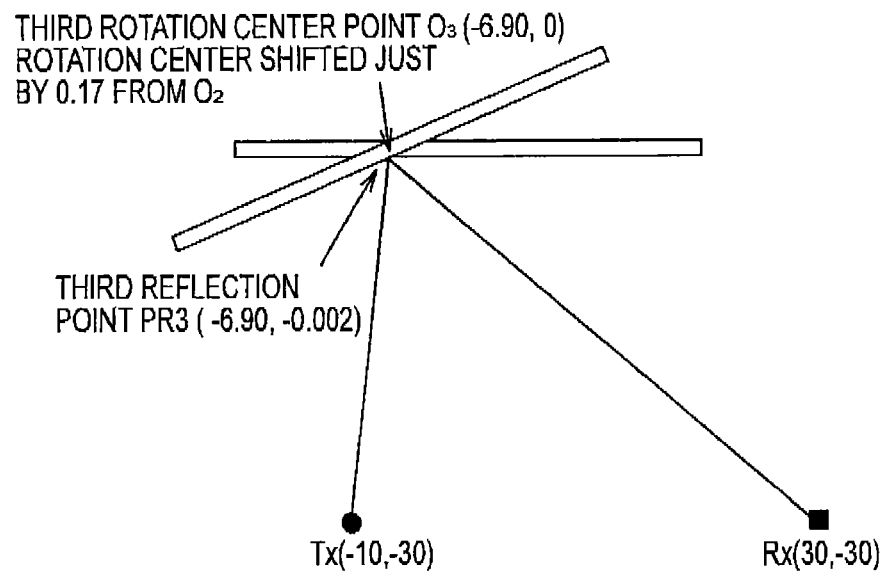
FIG. 12 is a diagram for explaining a propagation path estimation method according to the fourth embodiment of the present invention (third time).

A subsequent step is described with reference to FIG. 12. A point (−6.90, 0) to which the rotation center is shifted by a distance (−0.17) along the reflection surface of the reflect array from $O_2$ is set as a third rotation center $O_3$. A virtual rotated reflect array is created by rotating by an angle η/2 with $O_3$ as a rotation center. That is, the virtual rotated reflect array is shifted in the horizontal direction in such a manner that the rotation enter of the virtual rotated reflect array overlaps $O_3$. A mirror image of the transmission point TX is created on the virtual reflect array rotated about $O_3$.

An intersection point with a straight line connecting a mirror image of Tx and the reception point RX to each other is set as PR3. On this basis, the coordinates of PR3 are (−6.90, 0.002). A calculated distance from the second rotation center to the reflection point PR3 is 0.005. In the present embodiment, convergence condition of the distance was set to ε<0.03.

Figure 13:
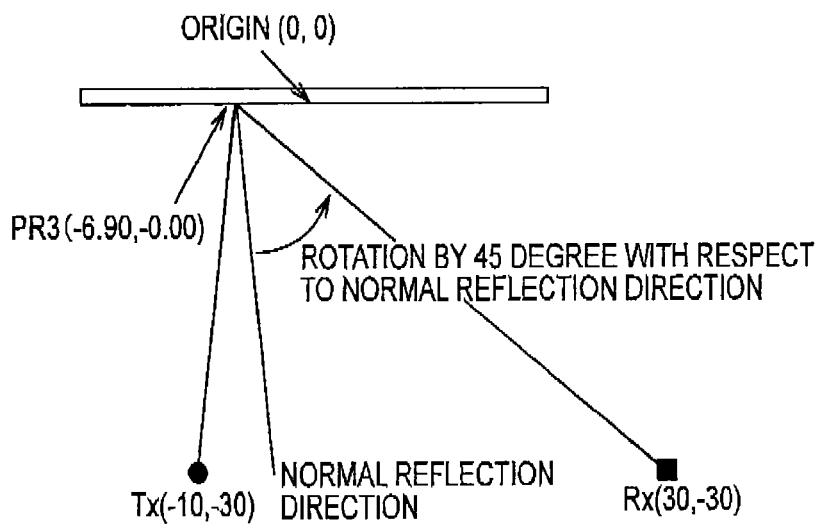
FIG. 13 is a diagram for explaining the propagation path estimation method according to the fourth embodiment of the present invention (after convergence).

FIG. 13 shows a positional relationship among the transmission point, the reception point and the reflection point converged by the calculation according to the present embodiment. As shown FIG. 13, it is understood that a propagation path is obtained for a radio wave which is emitted from the transmission point Tx, passes through the reflection point PR3, travels in a direction rotated just by 45 degrees from a normal reflection direction, and reaches RX.

Figure 14:
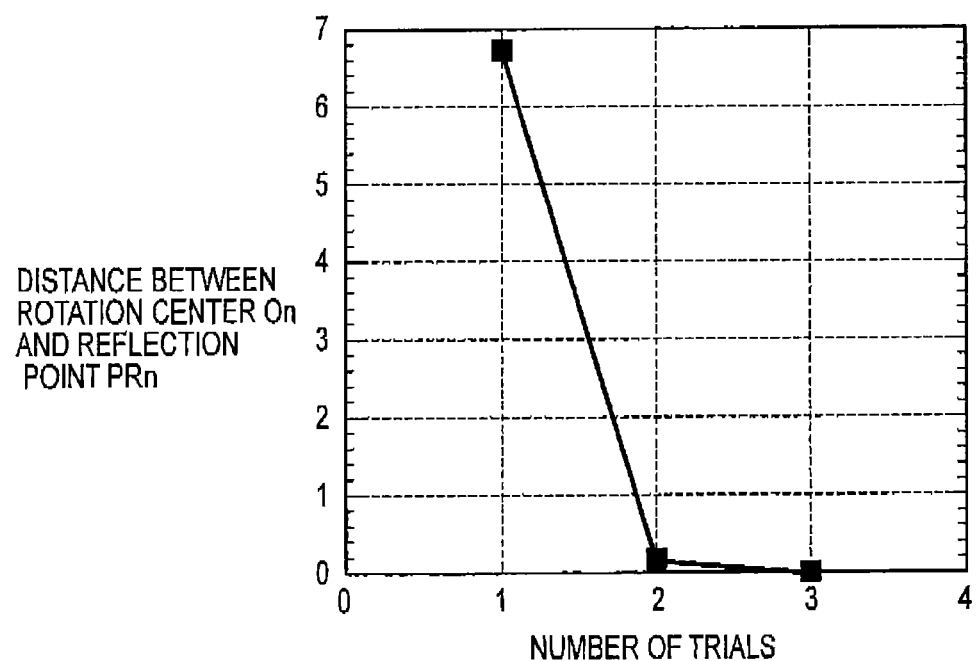
FIG. 14 is a diagram showing a convergence state of a distance from a rotation center of the reflection plate to the reflection point by the propagation path estimation method according to the fourth embodiment of the present invention.

FIG. 14 shows a convergence state of the distance from the rotation center to the reflection point. As shown in FIG. 14, It is understood that the distance from a rotation center On (n is an integer of 1, 2 or 3) to a reflection point PRn is converged rapidly as the number of trials increases.

As described above, the propagation path can be estimated by repeating the steps described above. Although a two-dimensional coordinate system is used in the above calculation example, calculation can be made even in a third-dimensional system by performing same steps.

Fifth Embodiment of the Invention

A propagation path estimation method according to a fifth embodiment of the present invention is described with reference to FIG. 15 to FIG. 29. In the present embodiment, a calculation example of a propagation path estimation method for a radio wave reflecting twice between the transmission point and the reception point is described by using specific values.

Figure 15:
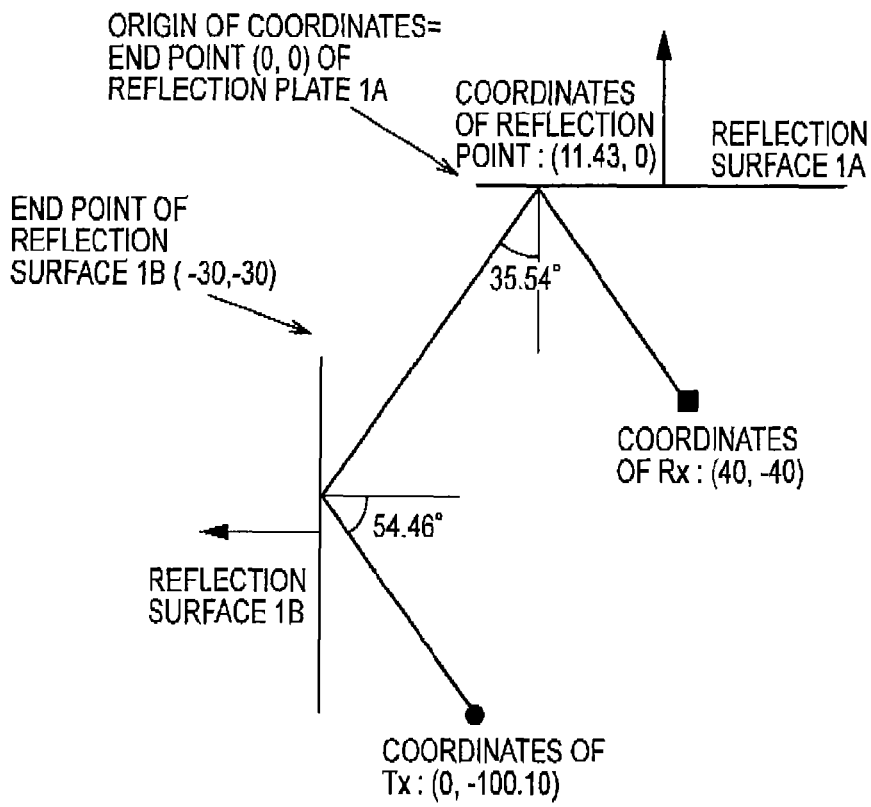
FIG. 15 is a diagram for explaining a propagation path estimation method according to a fifth embodiment of the present invention (before rotation of reflection plate).

FIG. 15 is a diagram for explaining a method obtaining a propagation path having two reflection surfaces including a surface of the reflect array and two reflections. FIG. 15 shows a two-dimensional coordinate having one end of the reflection surface 1A of the reflect array as an origin (0, 0). In this embodiment, one reflection each on two reflection surfaces from the transmission point Tx is described with the coordinates of the transmission point Tx at (0, −100) and the coordinates of the reception point Rx at (40, −40).

A first reflection surface is set as the reflection surface 1A of the reflect array, and a second reflection surface is set as a wall surface of normal reflection. An image point Tx' of the transmission point Tx with respect to a reflection surface 1B and an image point Tx" of Tx' with respect to a reflection surface 1A of are created. The coordinates of Tx" thus created are (−60, −100).

Figure 16:
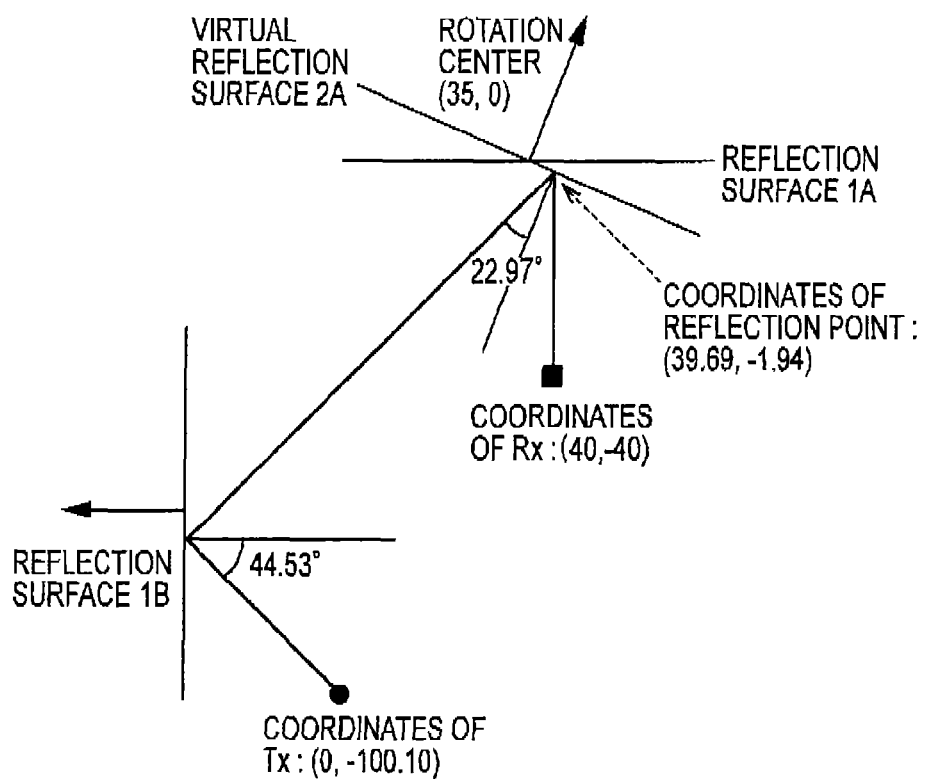
FIG. 16 is a diagram for explaining the propagation path estimation method according to the fifth embodiment of the present invention (first 45-degree rotation).

FIG. 15 shows a state of reflection surfaces of the reflect array not rotated. FIG. 16 shows a calculation example when the reflection surface 1A is rotated. In this embodiment, a calculation example is described for a virtual reflection surface 2A which is rotated just by $\eta/2=22.5$ degrees, where the rotation angle $\eta$ 45 degrees. A first rotation center point is set as a midpoint (35, 0) of the reflection surface 1A. The coordinates of the reflection point on the rotated reflection surface (39.69, −1.94).

A subsequent step is described with reference to FIG. 16. A distance between a first rotation center (35, 0) and the coordinates of a first reflection point (39.69, −1.94) is 5.07. A second rotation center is defined as a point where the first rotation point is shifted in a direction reducing the distance to the first reflection point just by 5.07, or at the coordinates of (40.07, 0).

Figure 17:
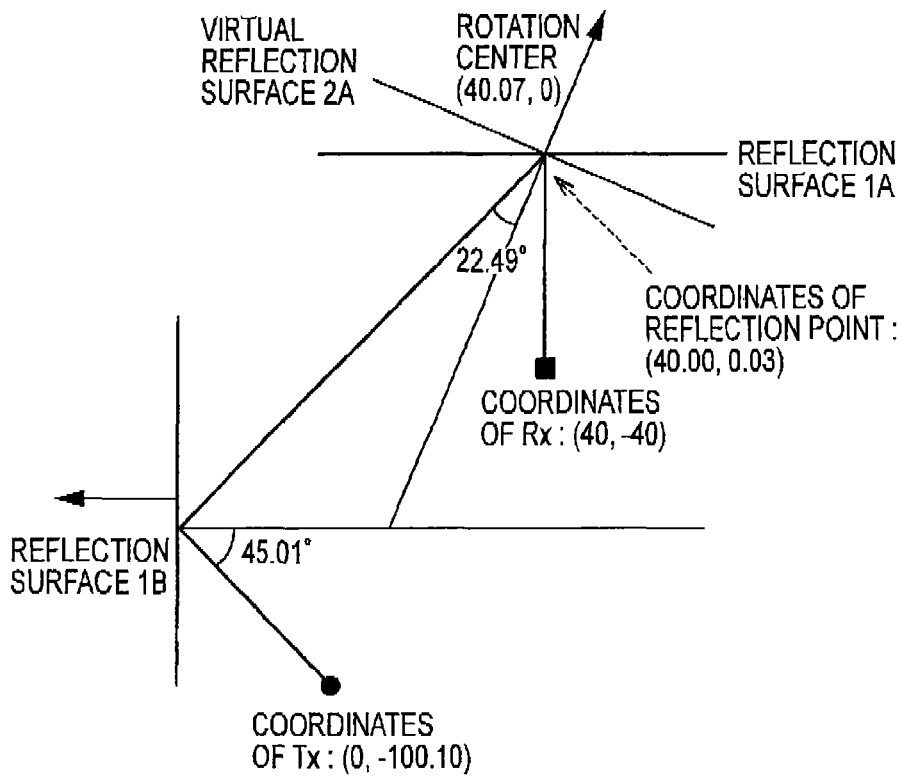
FIG. 17 is a diagram for explaining the propagation path estimation method according to the fifth embodiment of the present invention (second 45-degree rotation).

As shown in FIG. 17, a virtual reflection surface 2A rotated just by $\eta/2=22.5$ degrees about the second rotation center is calculated. The coordinates of the reflection point thus obtained are (40.00, 0.03).

Figure 18:
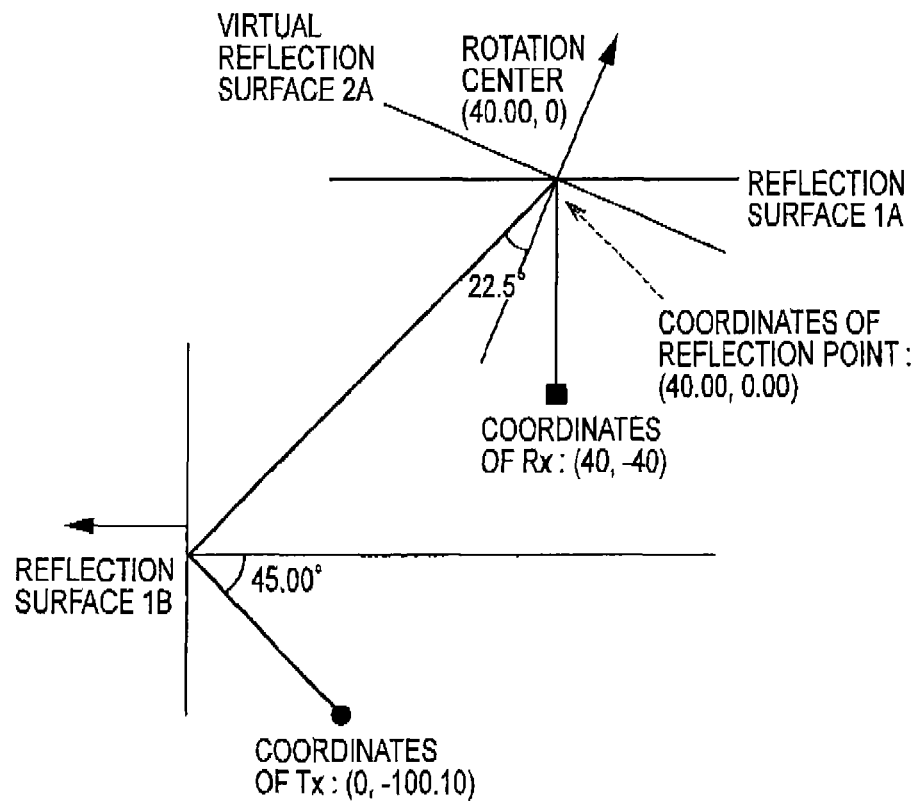
FIG. 18 is a diagram for explaining the propagation path estimation method according to the fifth embodiment of the present invention (third 45-degree rotation).

Next, s third rotation is calculated in a similar manner. A distance between the second rotation center (40.07, 0) and the second reflection point (40.00, 0.003) is 0.073. A third rotation center is defined as a point where the second rotation point is shifted in a direction reducing the distance to the second reflection point just by 0.073. The coordinates of the third rotation center thus obtained are (40.00, 0). As shown in FIG. 18, the coordinates of the reflection point is (40.00, 0.00).

Figure 19:
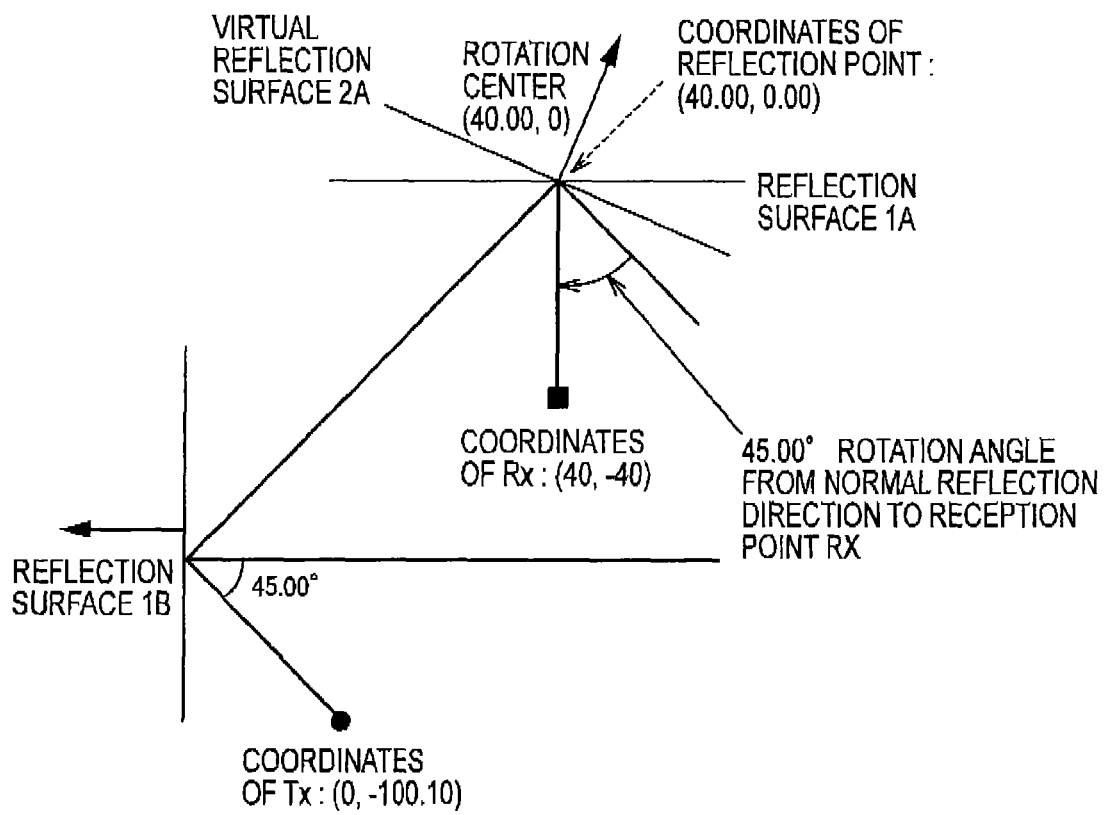
FIG. 19 is a diagram for explaining the propagation path estimation method according to the fifth embodiment of the present invention (45-degree rotation after convergence).

FIG. 19 shows a propagation path after convergence of the calculation. Compared with a normal propagation path of normal reflection, a propagation path that reaches RX through a reflection point on the reflect array LA and is obtained by calculation is a propagation path in which the reflection surface 1A is rotated by 45 degrees clockwise, which is equal to the designed value of $\eta$.

Figure 20:
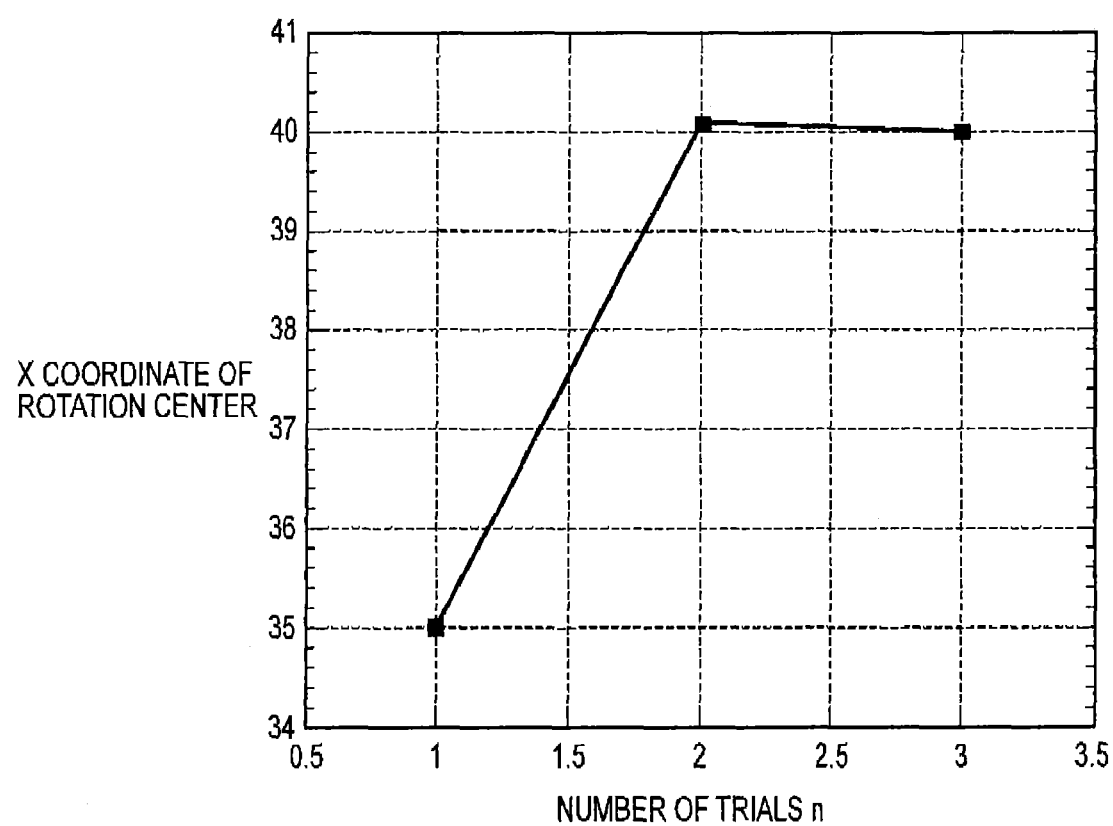
FIG. 20 is a diagram showing a convergence state of the reflection point by the propagation path estimation method according to the fifth embodiment of the present invention (Part 1 with 45-degree rotation).
Figure 21:
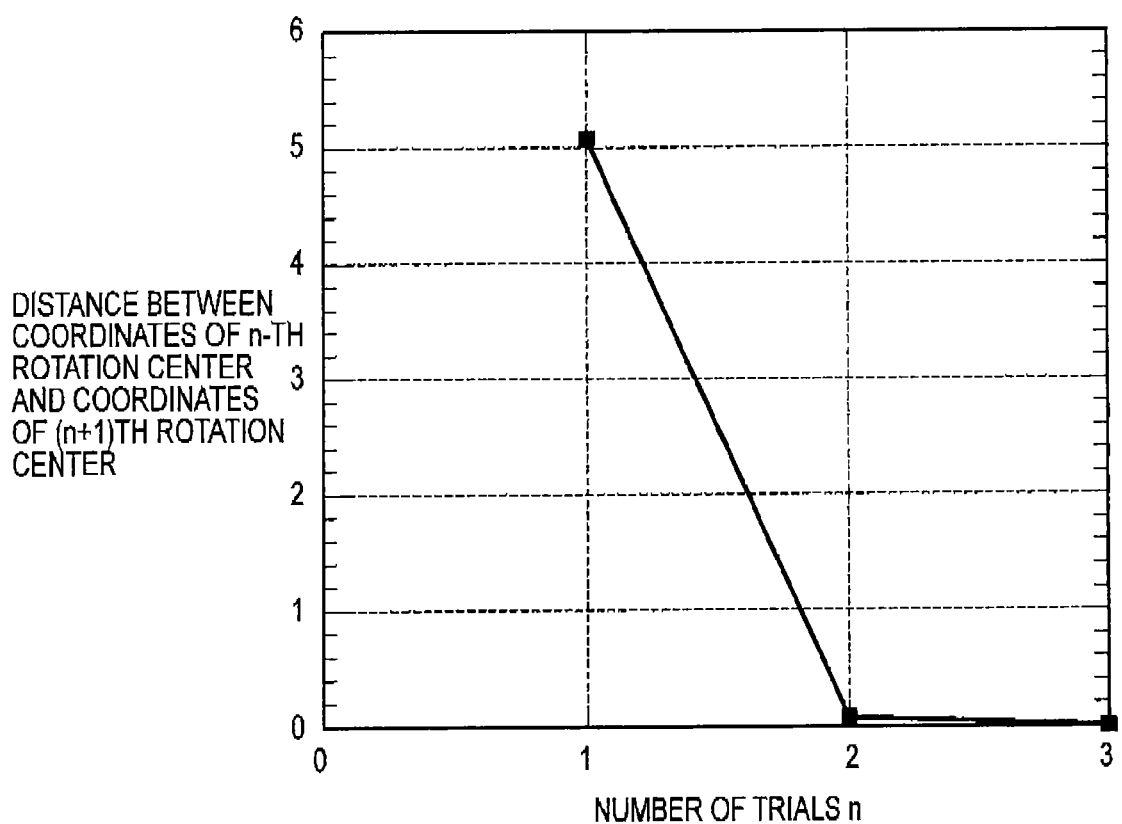
FIG. 21 is a diagram showing a convergence state of a distance to the reflection point by the propagation path estimation method according to the fifth embodiment of the present invention (Part 2 with 45-degree rotation).
Figure 22:
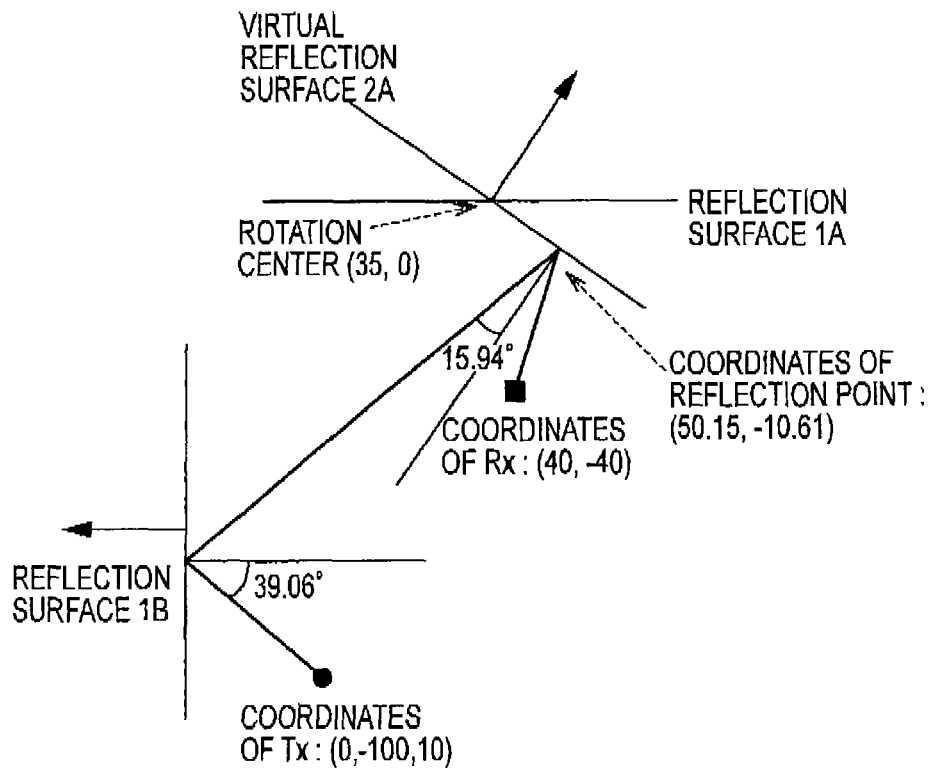
FIG. 22 is a diagram showing the propagation path estimation method according to the fifth embodiment of the present invention (first 70-degree rotation).
Figure 23:
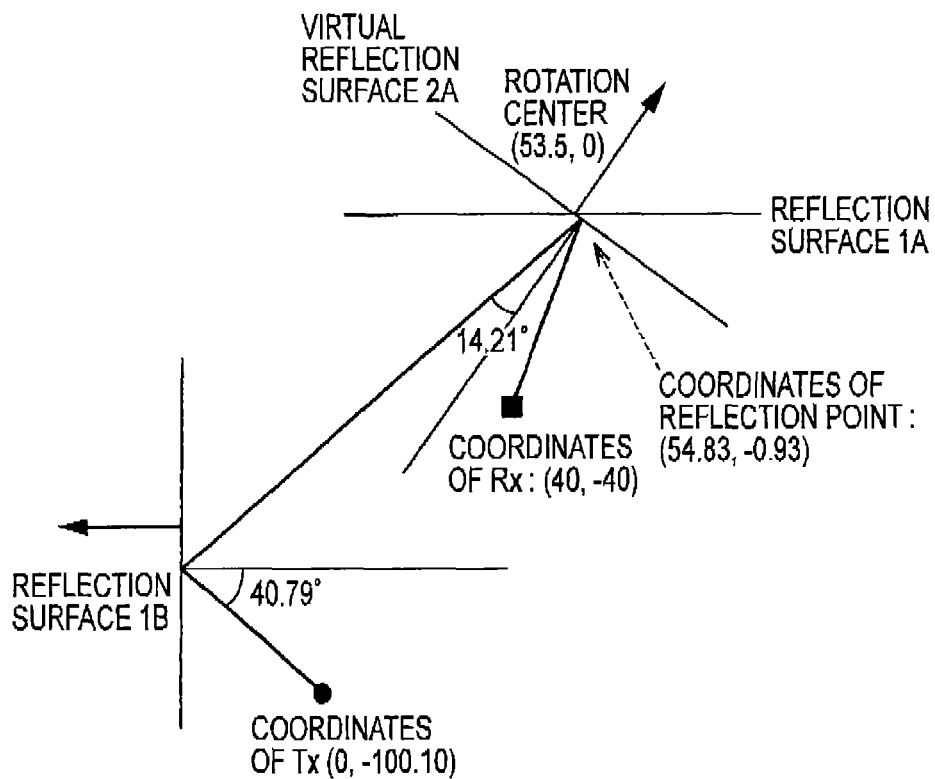
FIG. 23 is a diagram showing the propagation path estimation method according to the fifth embodiment of the present invention (second 70-degree rotation).
Figure 24:
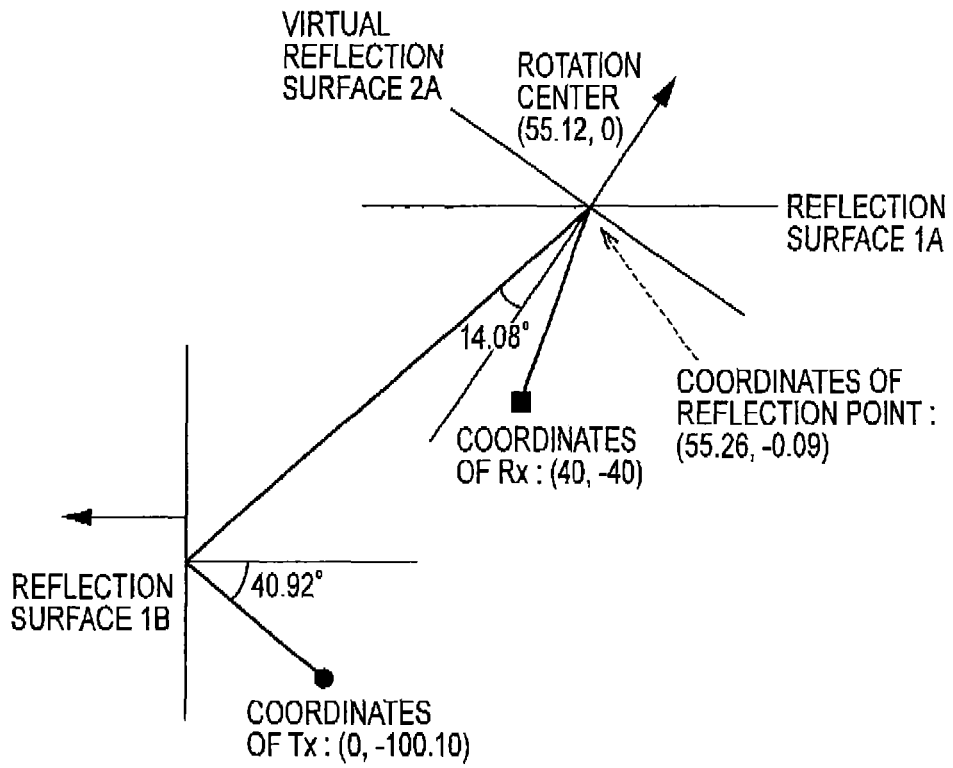
FIG. 24 is a diagram showing the propagation path estimation method according to the fifth embodiment of the present invention (third 70-degree rotation).
Figure 25:
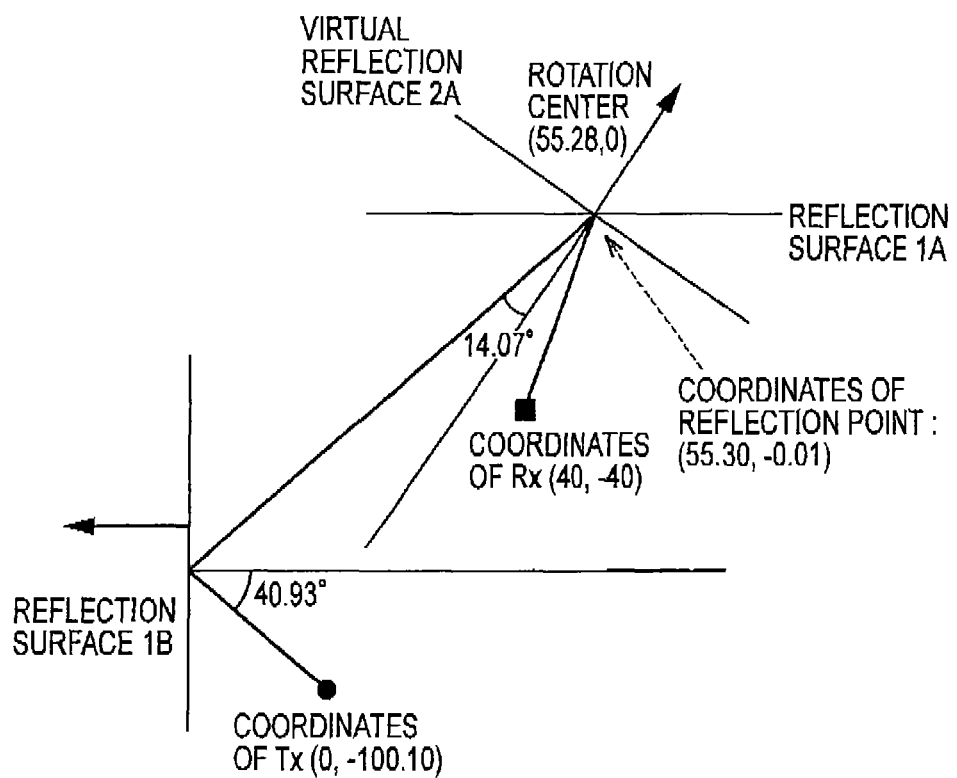
FIG. 25 is a diagram showing the propagation path estimation method according to the fifth embodiment of the present invention (fourth 70-degree rotation).
Figure 26:
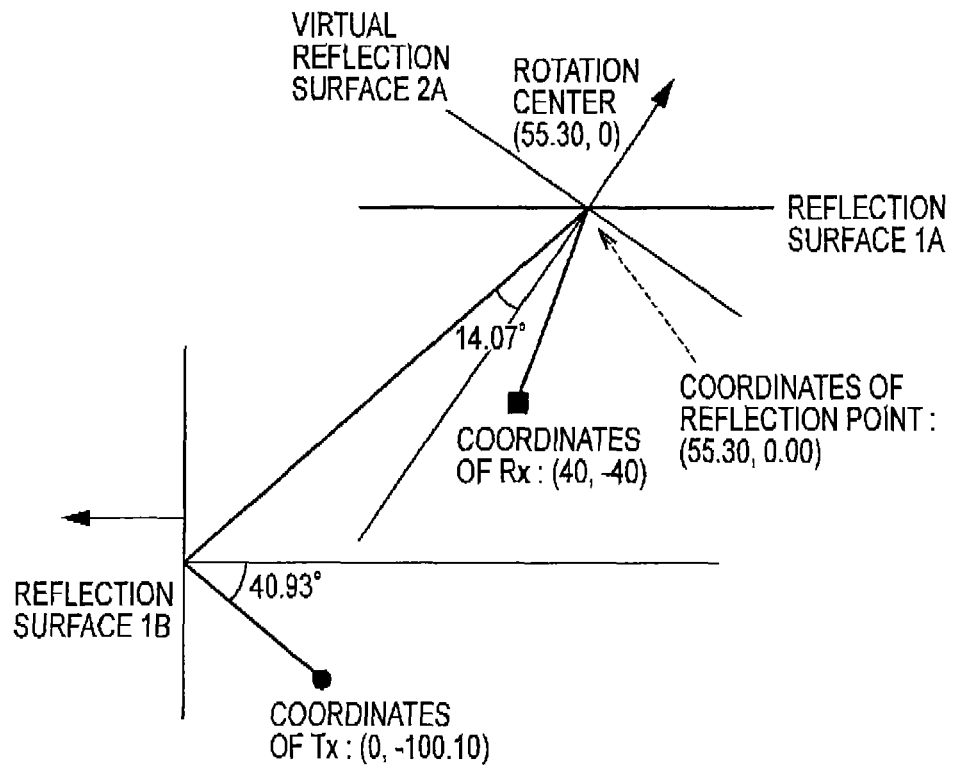
FIG. 26 is a diagram showing the propagation path estimation method according to the fifth embodiment of the present invention (fifth 70-degree rotation).

FIG. 20 and FIG. 21 show convergence states of the propagation path. In FIG. 20, the vertical axis represents the X coordinate of the rotation center, and the horizontal axis represents the number of trials. In FIG. 21, the vertical axis represents the distance between the coordinates of an n-th rotation center and the coordinates of an (n+1)th rotation center, and the horizontal axis represents the number of trials n.

As shown in FIG. 20 and FIG. 21, it is understood that the distance is almost converged by two trials. In the present embodiment, convergence condition of the distance is defined as $\epsilon<0.03$.

FIGS. 22 to 29 show example of the above calculation performed with the rotation angle $\eta=70$ degrees. The reflection surface is rotated by $\eta/2=35°$ about a first rotation center (35, 0) of the reflection surface of the reflect array 1A. The coordinates of the first reflection point thus obtained are (50.15, −10.61).

A distance from the first rotation center to the reflection point is 18.50. A second rotation center can be obtained by shifting the first rotation center in a direction reducing the distance to the reflection point just by 18.50. The coordinates of the second rotation center thus obtained are (53.50, 0).

Figure 27:
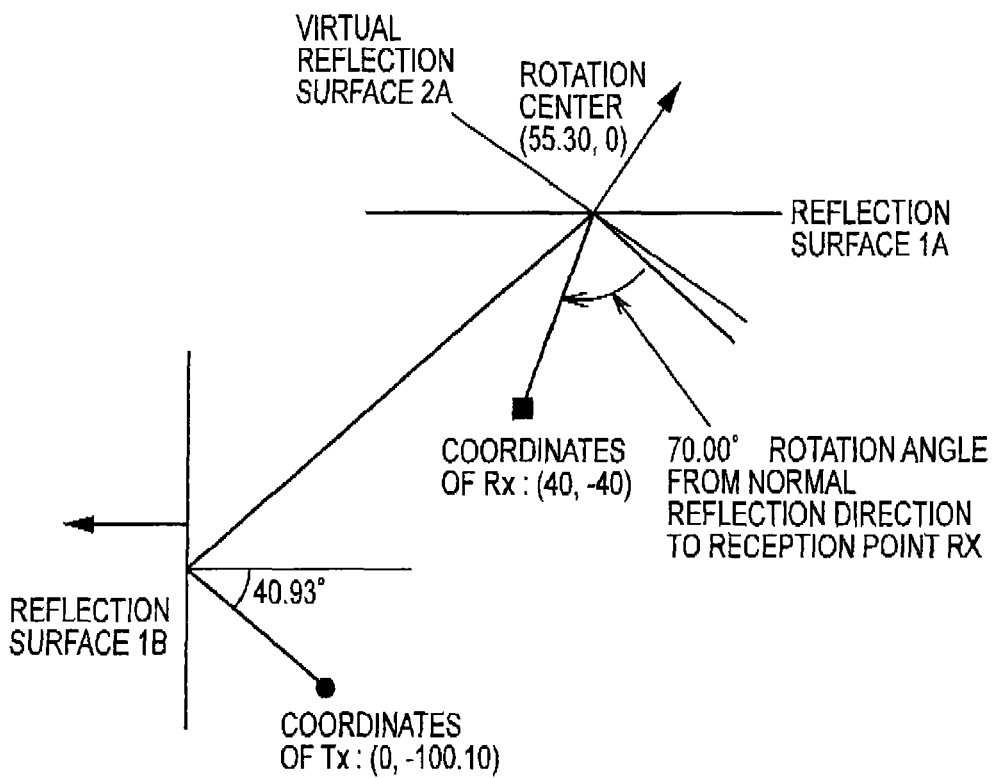
FIG. 27 is a diagram showing the propagation path estimation method according to the fifth embodiment of the present invention (fifth 70-degree rotation).

In a subsequent step, a reflection point is obtained by rotating the reflection surface by $\eta/2=35°$ about the second rotation center. By repeating those steps, a propagation path with a rotation angle of 70 degrees also can be obtained when $\eta=70$ degrees as shown in FIG. 27.

FIGS. 28 and 29 show convergence states of the propagation path similarly with FIGS. 20 and 21. It is understood that convergence is in progress rapidly as the number of trials increase.

Aspects of the present embodiment described above may be expressed as follows.

A first aspect of the present embodiment is summarized as a propagation path estimation method using an imaging method, which includes a step of, in a case where a reflect array 1 (structure) which causes reflection and scattering in a different direction $(\theta-\eta)°$ from a specular reflection direction $\theta°$ exists on a propagation path, rotating the reflect array 1 by $\eta/2°$ about a rotation center point to set a virtual rotated reflect array 2 (virtual structure), and estimating the propagation path by using the virtual rotated reflect array 2.

In the first aspect of the present embodiment, the above step may be repeated by shifting the rotation center O until the rotation center O coincides with a reflection point PRn on the reflect array 1.

In the first aspect of the present embodiment, the step described above may include a step A of determining the rotation center O, a step B of setting the virtual rotated reflect array 2 by rotating the reflect array 1 Y times (for example, one time) about the rotation center O, a step C of calculating a reflection point PR on the virtual rotated reflect array 2 by applying the imaging method to the virtual rotated reflect array 2, and a step D of updating the rotation center O to "O−|PR−O|" when a distance between the reflection point PR and the rotation center O does not satisfies the convergence condition, and the steps B to D may be repeated until the distance between the reflection point PR and the rotation center O satisfies the convergence condition.

In the first aspect of the present embodiment, the step described above may include a step A of determining the rotation center point O, a step B of setting the virtual rotated reflect array 2 by rotating the reflect array 1 Y times (for example, one time) about the rotation center point O, a step C of calculating the reflection point PR on the virtual rotated reflect array 2 by applying the imaging method of the virtual rotated reflect array 2, and a step D of updating the rotation center point O to "O−Δs×n" when the distance between the reflection point PR and the rotation center point O does not satisfies the convergence condition, and the steps B to D may be repeated until the distance between the reflection point PR and the rotation center point O satisfies the convergence condition.

In the first aspect of the present embodiment, η° may be a function of θ°.

A second aspect of the present embodiment is a program or an apparatus causing a computer to implement the propagation path estimation method described above.

In other words, the propagation path estimation method may be implemented by hardware, a software module run by a processor, or a combination thereof.

The software module may be provided in a storage medium of any type including RAM (Random Access Memory), flash memory, ROM (Read Only Memory), EPROM (Erasable RProgrammable ROM), EEPROM (Electrically Erasable and Reprogrammable ROM), register, hard disk drive, removable disk, and CD-ROM.

The storage medium is connected to the processor in such a manner that the processor can read and write information from and into the storage medium. Instead, the storage medium may be incorporated in the processor. Further, the storage medium may be provided inside ASIC.

Although the present invention is described in detail with reference to the above embodiments, it is apparent to those skilled in the art that the present invention is not limited to the embodiments described herein. The present invention may be implemented by a modification or an alteration without departing from the spirit and the scope defined in the claims. Accordingly, the description herein is intended for illustrative description purpose without limiting the present invention.

Japanese Patent Application Publication No. 2009-277070 (filed on Dec. 4, 2009) is fully incorporated herein by reference.

INDUSTRIAL APPLICABILITY

The present invention provides a propagation path estimation method, program and apparatus that are capable of estimating a propagation path in a propagation analysis model including a directional scatterer and of performing a ray trace analysis and an analysis applying a geometric-optical model. Therefore, the present invention is useful in a wireless communication and the like.

EXPLANATION OF REFERENCE NUMERALS

1 . . . Reflection array
1A . . . Reflection surface
1B . . . Virtual parallel movement reflection surface
2 . . . Virtual rotated reflect array
2A, 2B . . . Virtual rotated reflection surface

The invention claimed is:

1. A propagation path estimation method carried out by an apparatus, the propagation path estimation method using an imaging method for estimating a propagation path of a radio wave using a specular reflection, the propagation path estimation method comprising:
transmitting the radio wave by a transmitter;
reflecting and scattering the radio wave in a different direction (θ-η)° from a specular reflection direction θ° path by a reflect array structure on the propagation path;
rotating virtually the reflect array structure by (η/2)° about a rotation center point O by a processor of the apparatus, the processor coupled to a storage medium that is provided inside application specific integrated circuit (ASIC) and the processor reading and writing information from and into the storage medium for the rotation;
determining a reflection point PR on the rotated reflect array;
updating the rotation center point O when a distance between the reflection point PR and the rotation center point O does not satisfy a convergence condition;
repeating the rotation and determination until the convergence condition is satisfied;
estimating, by the processor, the propagation path of the radio wave when the convergence condition is satisfied; and
applying the estimated propagation path to provide a required communication link quality in a wireless communication system.

2. The propagation path estimation method according to claim 1, wherein the rotation center point is repeatedly shifted until the rotation center point coincides with a reflection surface on the structure.

3. The propagation path estimation method according to claim 1 or 2, wherein
the propagation path estimation method further comprises:
a step A of determining the rotation center point O;
a step B of setting the reflect array structure by rotating the reflect array structure Y times about the rotation center O;
a step C of calculating the reflection point PR on the reflect array structure by applying the imaging method to the reflect array structure; and
a step D of updating the rotation center point to "O-|PR-O|" when the distance between the reflection point PR and the rotation center point O does not satisfy the convergence condition, and
the steps B to D are repeated until the distance between the reflection point PR and the rotation center point O satisfies the convergence condition.

4. The propagation path estimation method according to claim 1 or 2, wherein the propagation path estimation method further comprises:
a step A of determining the rotation center point O;
a step B of setting the reflect array structure by rotating the reflect array structure Y times about the rotation center O;
a step C of calculating the reflection point PR on the reflect array structure by applying the imaging method to the reflect array structure; and
a step D of updating the rotation center point to "O−Δs×n" when the distance between the reflection point PR and the rotation center point O does not satisfy the convergence condition, "Δs" being a threshold value and "n" being an integer number greater than zero, and
the steps B to D are repeated until the distance between the reflection point PR and the rotation center point O satisfies the convergence condition.

5. The propagation path estimation method according to any one of claims 1 and 2, wherein the η° is a function of the θ°.

6. A non-transitory computer readable medium storing computer readable instructions thereon that, when executed by a computer, causes the computer to perform the propagation path estimation method according to any one of claims 1 and 2.

7. An apparatus comprising a computer configured to implement the propagation path estimation method according to any one of claims 1 and 2.

* * * * *